US012598920B2

(12) United States Patent
Endoh et al.

(10) Patent No.: US 12,598,920 B2
(45) Date of Patent: Apr. 7, 2026

(54) MAGNETORESISTIVE ELEMENT AND MAGNETIC MEMORY DEVICE

(71) Applicant: TOHOKU UNIVERSITY, Sendai (JP)

(72) Inventors: Tetsuo Endoh, Sendai (JP); Hiroshi Naganuma, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 623 days.

(21) Appl. No.: 17/899,868

(22) Filed: Aug. 31, 2022

(65) Prior Publication Data

US 2023/0147268 A1 May 11, 2023

(30) Foreign Application Priority Data

Sep. 1, 2021 (JP) ................................. 2021-142659

(51) Int. Cl.
| | |
|---|---|
| *H10N 52/80* | (2023.01) |
| *H10B 61/00* | (2023.01) |
| *H10N 52/85* | (2023.01) |

(52) U.S. Cl.
CPC ............. *H10N 52/80* (2023.02); *H10B 61/00* (2023.02); *H10N 52/85* (2023.02)

(58) Field of Classification Search
CPC ............................ H10N 52/80; G11C 11/1675
See application file for complete search history.

(56) References Cited

U.S. PATENT DOCUMENTS

| | | | | |
|---|---|---|---|---|
| 2020/0136023 A1* | 4/2020 | Tsumita | .............. | G11C 11/1675 |
| 2021/0020695 A1* | 1/2021 | Bak | ..................... | G11C 13/0028 |
| 2021/0151665 A1* | 5/2021 | Komura | .................. | G11C 11/18 |
| 2022/0285609 A1* | 9/2022 | Huang | .................. | H10N 50/10 |

FOREIGN PATENT DOCUMENTS

| | | |
|---|---|---|
| JP | 2018-157108 A | 10/2018 |

OTHER PUBLICATIONS

Impedance Matching, Wikipedia, archived Mar. 10, 2020 (Year: 2020).*

* cited by examiner

*Primary Examiner* — Shih Tsun A Chou
(74) *Attorney, Agent, or Firm* — Rabin & Berdo, P.C.

(57) ABSTRACT

A magnetoresistive effect element includes a reference layer, a barrier layer, a recording layer, and a channel layer that are disposed on top of one another, and a first terminal connected to the reference layer, and a second terminal and a third terminal connected to the channel layer. The channel layer includes a first channel layer and a second channel layer, the first channel layer has electrical resistance larger than electrical resistance of the second channel layer, the second terminal is connected to the first channel layer, and the third terminal is connected to the second channel layer, a write current flows between the second terminal and the third terminal via the first channel layer and the second channel layer, and a read current flows between the first terminal and the third terminal.

14 Claims, 16 Drawing Sheets

"1" is stored
Low Resistance R$_P$

Comparison
Example 1

Comparison
Example 2

MAGNETORESISTIVE ELEMENT AND MAGNETIC MEMORY DEVICE

TECHNICAL FIELD

The present invention relates to a magnetoresistive effect element and a magnetic memory device.

BACKGROUND ART

Non-volatile memory devices using a magnetoresistive effect element (MRAM) are drawing attention as next-generation logic integrated circuits. Among those MRAMs, a three-terminal SOT-MRAM (spin-orbit torque magnetic memory) is known to be suitable for nonvolatile memory that requires high-speed writing. For example, Japanese Patent Application Laid-open Publication No. 2018-157108 discloses a three-terminal SOT (spin-orbit torque)-MRAM (magnetic random access memory) having a multilayer structure of a channel layer, a recording layer, a barrier layer, and a reference layer.

FIG. 19 illustrate the basic configuration of the SOT-MRAM disclosed in Patent Literature 1.

As illustrated in the figure, this SOT-MRAM 1000 is constituted of a multilayer body made up of a channel layer 1111, a recording layer 1112, a barrier layer 1113, and a reference layer 1114, and includes three terminals T11, T12, and T13.

The channel layer 1111 is a conductive layer made of a heavy metal or the like, and a region where the spin orbit torque is generated when the write current flows.

The recording layer 1112 is a magnetic layer made of a magnetic body, and the magnetization M1112 can be switched between the +X axis direction and the −X axis direction by the spin orbit torque generated by the write current that flows through the channel layer 1111.

The barrier layer 1113 is a non-magnetic layer made of a tunnel insulating layer.

The reference layer 1114 is made of a magnetic body, and the direction of magnetization M1114 is fixed.

When data is written to SOT-MRAM 1000, a voltage corresponding to data to be written is applied between the terminal T12 and the terminal T13, and the write current is made to flow through the channel layer 1111. As a result, due to the effect of the spin orbit torque, the direction of magnetization M1112 of the recording layer 1112 changes based on the flowing direction of the write current.

When the direction of magnetization M1112 of the recording layer 1112 is the same as the direction of magnetization M1114 of the reference layer 1114 (parallel state), resistance between the reference layer 1114 and the recording layer 1112 decreases. On the other hand, when the direction of magnetization M1112 of the recording layer 1112 is opposite to the direction of magnetization M1114 of the reference layer 1114 (antiparallel state), resistance between the reference layer 1114 and the recording layer 1112 becomes relatively large. Data is assigned to various resistance values.

When data is read out of the SOT-MRAM 1000, a read voltage is applied between the terminal T11 and the terminal T12 or T13 (in this example, T13), and data corresponding to the size of the resultant read current $I_R$ is outputted.

CITATION LIST

Patent Literature

[Patent Literature 1] Japanese Patent Application Laid-open Publication No. 2018-157108

SUMMARY OF THE INVENTION

Problems to be Solved by the Invention

The channel layer 1111 is made of a heavy metal that is conductive. Thus, the write current that flows through the channel layer 1111 in data writing is large, which increases power consumption.

One way to reduce the write current is to increase the resistance of the channel layer 1111.

However, in data reading, the read current $I_R$ flows through a part of the channel layer 1111, and therefore, if the resistance value of the channel layer 1111 is made larger, then the resistance component in that portion would become load resistance and the read current would be smaller. This would reduce the TMR ratio (Tunnel magnetic resistance ratio), and as a result, the reading speed would be slower. The more integrated the SOT-MRAM is, the more significant this problem becomes.

The TMR ratio is represented by the following formula where $R_P$ is the resistance between the reference layer 1114 and the recording layer 1112 in the parallel state, $R_{AP}$ is the resistance between the reference layer 1114 and the recording layer 1112 in the antiparallel state, and $R_L$ is the load resistance between the terminal T3 and the junction surface where the recording layer 1112 and the channel layer 1111 make contact with each other:

$$TMR=[(R_{AP}+R_L)-(R_P+R_L)]/(R_P+R_L)=(R_{AP}-R_P)/(R_P+R_L)$$

As this formula indicates, the greater the load resistance $R_L$, the smaller the TMR ratio. Also, the lower the TMR ratio, the longer the reading time (time required for data reading). This makes it difficult to perform a high-speed reading operation.

The present invention was made in view of the situations described above, and an object thereof is to provide a magnetoresistive effect element that can achieve low power consumption and high speed reading, and a magnetic memory device using such a magnetoresistive effect element.

To achieve the above object, a magnetoresistive effect element according to the present invention includes: a reference layer, a barrier layer, a recording layer, and a channel layer deposited on top of one another; and a first terminal connected to the reference layer, and a second terminal and a third terminal connected to the channel layer, wherein the channel layer includes a first channel layer and a second channel layer, wherein electrical resistance of the first channel layer is larger than electrical resistance of the second channel layer, wherein the second terminal is connected to the first channel layer, and the third terminal is connected to the second channel layer, wherein a write current flows between the second terminal and the third terminal via the first channel layer and the second channel layer, and wherein a read current flows between the first terminal and the third terminal.

For example, the reference layer is made of a ferromagnetic layer in which a magnetization direction is fixed, the barrier layer is made of a tunnel insulating layer, the recording layer is made of a ferromagnetic layer in which a magnetization direction is changed by a spin orbit torque generated by a write current that flows through the channel layer, the channel layer contains a heavy metal, the second terminal is connected to one end of the channel layer, and the third terminal is connected to the other end of the channel layer, the first channel layer includes an area of the channel layer between a junction surface of the channel layer and the recording layer and a connecting point of the second terminal, and the second channel layer includes an area of the channel layer between the joint surface and a connecting point of the third terminal.

The channel layer contains W, Ta, Pt, Pd, WOx, TaOx, PtOx, or PdOx.

The first channel layer is thinner than the second channel layer.

The first channel layer is longer than the second channel layer. The first channel layer is in a spiral shape.

The first channel layer is narrower than the second channel layer.

The first channel layer has a higher resistance rate than that of the second channel layer.

A circuit element connected to the second terminal has higher resistance than that of a circuit element connected to the third terminal. The circuit element includes a transistor, and ON resistance of a transistor constituting the circuit element connected to the second terminal is higher than ON resistance of a transistor constituting the circuit element connected to the third terminal.

A magnetic memory device according to the present invention includes, as a memory cell, the above magnetoresistive effect element.

According to the present invention, the channel layer has a first channel layer and a second channel layer having differing resistance values from each other. As a result, it is possible to adjust the overall resistance value of the channel layer, which is the combined resistance of the first channel layer and the second channel layer, to a value appropriate for suppressing the power consumption. On the other hand, the resistance value of the current path of the read current that flows between the first terminal and the third terminal can be suppressed by the resistance of the second channel layer, which makes it possible to increase the read current to a relatively large value to achieve high-speed reading.

BRIEF DESCRIPTION OF THE DRAWINGS

FIG. 1A is a front view and FIG. 1B is a plan view.

FIG. 4A is a diagram for explaining the write operation, FIG. 4B is a waveform diagram of the write current, and FIG. 4C is an equivalent circuit.

FIG. 5A is a diagram for explaining the write operation, FIG. 5B is a waveform diagram of the write current, and FIG. 5C is an equivalent circuit.

FIG. 7A is a diagram for explaining the operation to read data out of a magnetoresistive effect element where data "0" is stored, and FIG. 7B is an equivalent circuit.

FIG. 8A is a diagram for explaining the operation to read data out of a magnetoresistive effect element where data "1" is stored, and FIG. 8B is an equivalent circuit.

DETAILED DESCRIPTION OF EMBODIMENTS

A magnetoresistive effect element according to an embodiment of the present invention and a magnetic memory device using the magnetoresistive effect element as a memory cell will be described with reference to the figures.

Figure 1A:
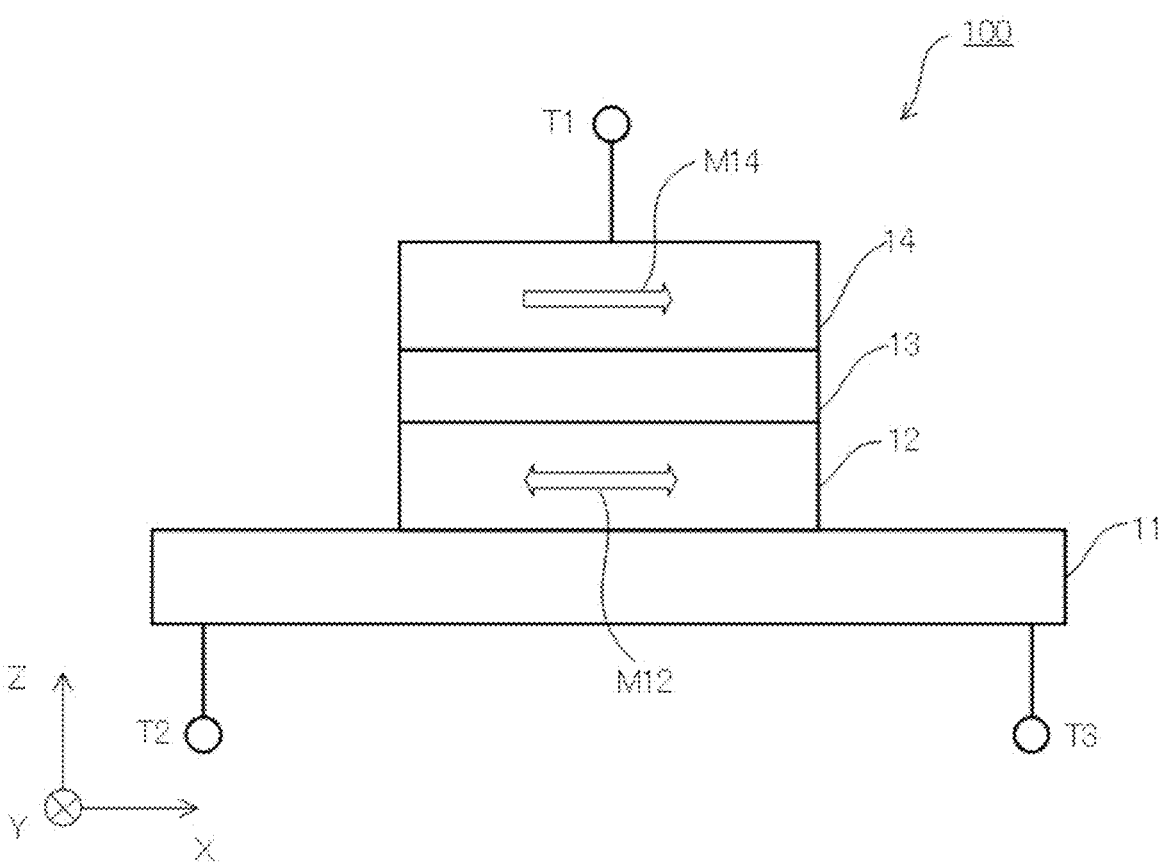
FIGS. 1A and 1B each illustrate the structure of a magnetoresistive effect element of an embodiment of the present invention.
Figure 1B:
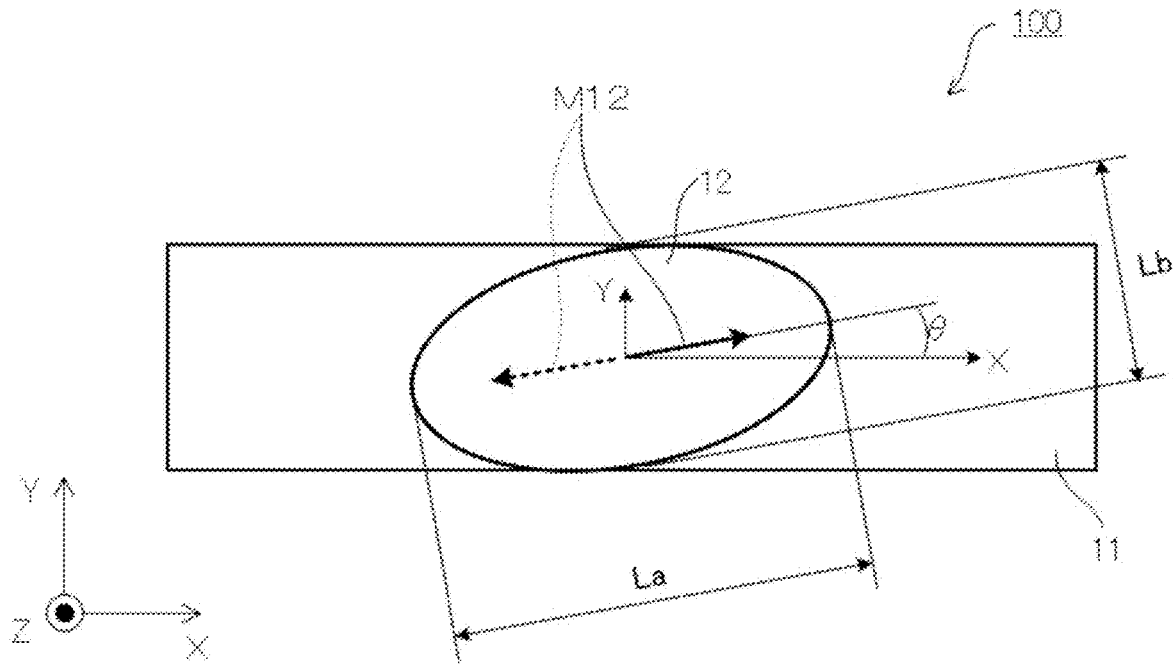
Figure 2:
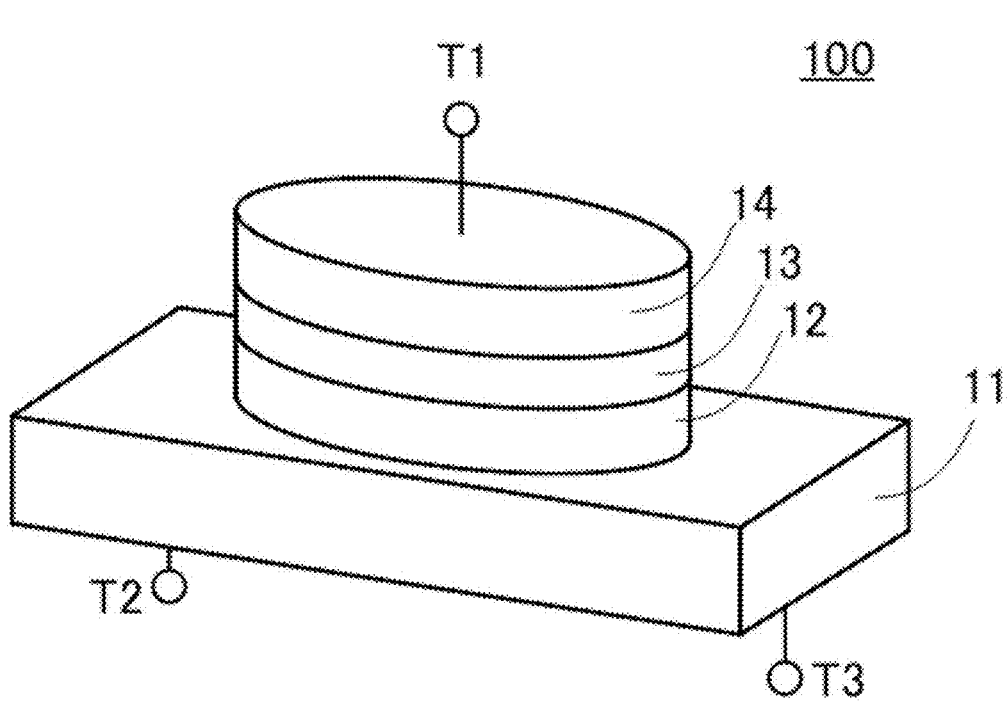
FIG. 2 a perspective view of a magnetoresistive effect element of an embodiment of the present invention.

As illustrated in the front view of FIG. 1A, the plan view of FIG. 1B, and the perspective view of FIG. 2, a magnetoresistive effect element 100 of an embodiment of the present invention is a three-terminal SOT (spin orbit torque)-MRAM (magnetic random access memory), and has a configuration in which a channel layer 11, a recording layer 12, a barrier layer 13, and a reference layer 14 are deposited in this order or a reversed order. This configuration is a basic configuration, and another layer may be added between any two layers, or any one layer may have multiple layers. Other components may also be added.

In the descriptions below, a XYZ cartesian coordinate system where the longitudinal direction (extending direction) of the channel layer 11 is the X axis direction, the traverse direction of the channel layer 11 is the Y axis direction, and the height direction along which the respective layers are deposited is the Z axis direction is set, and will be referenced to as necessary.

The channel layer 11 includes a heavy metal, and has a flat panel shape longer in the X axis direction. The channel layer 11 is a layer formed to be 0.5 to 40 nm-thick, 50 nm to 300 nm-long in the X axis direction, and 20 nm to 150 nm wide in the Y axis direction, for example.

When the write current is made to flow through the channel layer 11 in the longitudinal direction (±X axis direction), a spin orbit torque is generated, and this torque changes the direction of magnetization M12 of the recording layer 12. Thus, the channel layer 11 contains a heavy metal or an oxide of heavy metal with large spin-orbit interaction such as W, Ta, Pt. Pd, WOx. TaOx, PtOx, or PdOx, for example. The channel layer 11 may also contain Hf, Re, Os, Ir, Pb, or an alloy thereof. Alternatively, the channel layer 11 may be made of a material doped with those heavy metals and alloy. This material may be conductive or non-conductive. The channel layer 11 as a whole has conductivity. It is also possible to add another material such as B, C, N, O, Al, Si, P, Ga, or Ga as necessary, in order to attain a desired electrical characteristic or structure.

The recording layer 12 is a ferromagnetic layer made of a ferromagnetic body deposited on the channel layer 11, and made of a ferromagnetic material containing such as CoFeB, FeB, Fe, Co, Ni, and Mn or their alloy. The magnetization M12 of the recording layer 12 can be switched between the +X axis direction and the −X axis direction by the spin orbit torque generated by the write current that flows through the channel layer 11.

In this embodiment, the recording layer 12 is formed in an oval shape in a plan view as one example, and the long axis is tilted by $\theta$ with respect to the X axis. $\theta$ is approximately ±2 to ±35 degrees, for example. Therefore, in this embodiment, external magnetic field is not needed. However, it is also possible to set $\theta$ to 0 degree and provide an external magnetic field.

The recording layer 12 is formed to have an aspect ratio of 2.5 to 5.0, and to be 1.30 to 1.60 nm-thick, for example. The aspect ratio is the ratio of the long axis La relative to the short axis Lb of the surface of the recording layer as illustrated in FIG. 1B. In order to attain this aspect ratio, the recording layer 12 is formed to be about 10 to 60 nm-wide in the short axis direction, and about 40 to 600 nm in the long axis direction. By having the aspect ratio of this range, the recording layer 12, as a signal element, has the shape magnetic anisotropy in which the magnetization M12 is orientated in the long axis direction of the recording layer 12.

The barrier layer 13 is a tunnel insulating film made of a tunnel insulating material such as a material containing Mg and O, or more specifically, MgO, for example. The barrier layer 13 has the same planer shape as the recording layer 12, for example, and the thickness thereof is 0.1 to 5 nm.

The reference layer 14 is a ferromagnetic layer made of a ferromagnetic body deposited on the barrier layer 13. The direction of magnetization M14 of the reference layer 14 is set to the ±X axis direction. The reference layer 14 is made of a material similar to that of the recording layer 12. The reference layer 14 and the barrier layer 13 have the same outer shape.

On the reference layer 14, a first terminal (electrode) T1 is disposed and connected. At one end of the channel layer 11 in the extending direction, a second terminal (electrode) T2 is disposed and connected, and at the other end of the channel layer 11 in the extending direction, a third terminal (electrode) T3 is disposed and connected.

In this embodiment, the second terminal T2 and the third terminal T3 are used for the write operation. The write voltage is applied between the second terminal T2 and the third terminal T3, and the write current flows between the second terminal T2 and the third terminal T3 via the channel layer 11. For the read operation, the first terminal T1 and the third terminal T3 are used. The read volage is applied between the first terminal T1 and the third terminal T3, and the read current flows between the first terminal T1 and the third terminal T3 via the reference layer 14, the barrier layer 13, the recording layer 12, and the channel layer 11.

Figure 3:
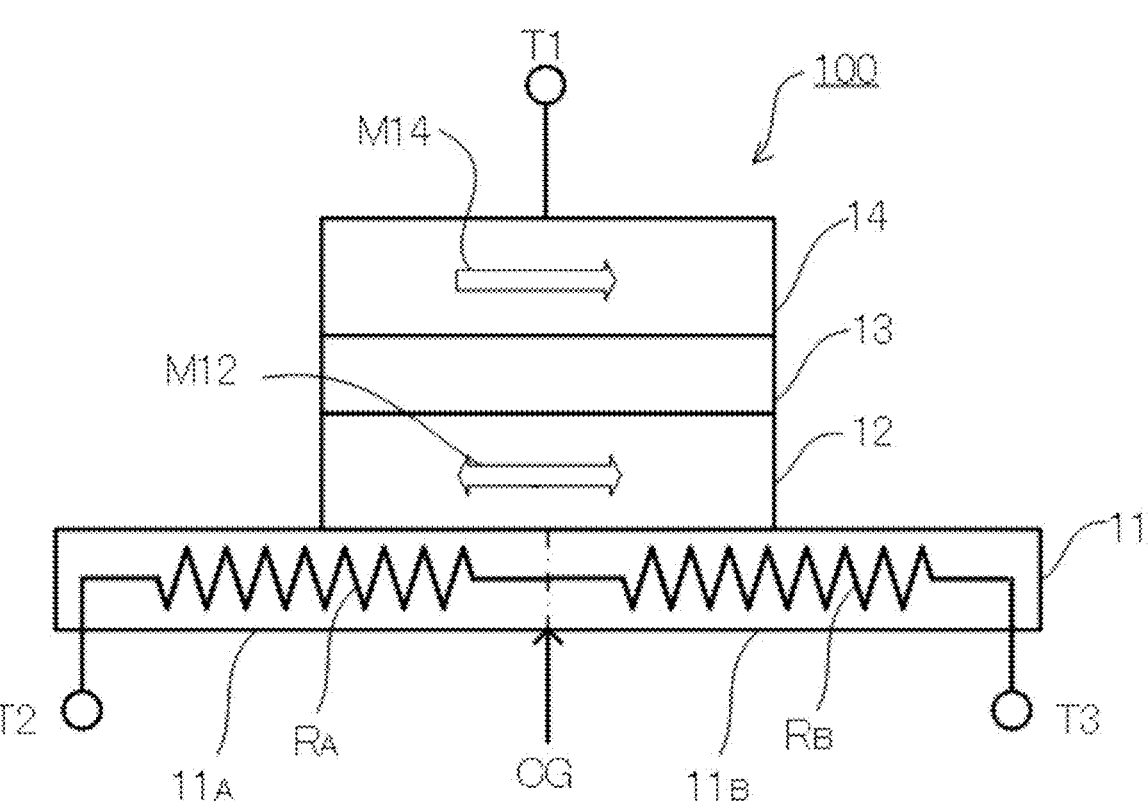
FIG. 3 a diagram for explaining the structure of a channel layer of a magnetoresistive effect element of an embodiment of the present invention.

As illustrated in FIG. 3, the channel layer 11 is logically or physically divided into a first channel layer 11A and the second channel layer 11B using the center of gravity CG of the oval junction surface with the recording layer 12. The first channel layer 11A is an area of the channel layer 11 where the write current flows, but the read current does not. The second channel layer 11B is an area of the channel layer 11 where both the write and read currents flow.

The resistance value of electrical resistance of the first channel layer 11A, or more specifically, the resistance value between the boundary area of the first channel layer 11A and the second channel layer 11B and the connecting point between the second terminal T2 and the first channel layer 11A is defined as $R_A$. Also, the resistance value of electrical resistance of the second channel layer 11B, or more specifically, the resistance value between the boundary area of the first channel layer 11A and the second channel layer 11B and the connecting point between the third terminal T3 and the second channel layer 11B is defined as $R_B$. The resistance value $R_A$ of the first channel layer 11A is a times as large as the resistance value $R_B$ of the second channel layer 11B ($\alpha$ is a real number greater than 1, such as 2 to 12 times, for example).

Generally, the resistance value between the second terminal T2 and the third terminal T3 is in a range of 200 to 500Ω, and is set to 400Ω, for example. Thus, the resistance value $R_A$ is set within a range of 150 to 460Ω, and the resistance value $R_B$ is set within a range of 20 to 200Ω. However, the values are not limited to those ranges.

The method to make the resistance value $R_A$ of the first channel layer 11A differ from the resistance value $R_B$ of the second channel layer 11B will be described later.

Next, the operation of the magnetoresistive effect element 100 having the configuration described above will be explained.

First, the write operation will be explained with reference to FIGS. 4 and 5.

First, the second terminal T2 and the third terminal T3 of the magnetoresistive effect element 100 are connected to a write circuit 110.

Figure 4A:
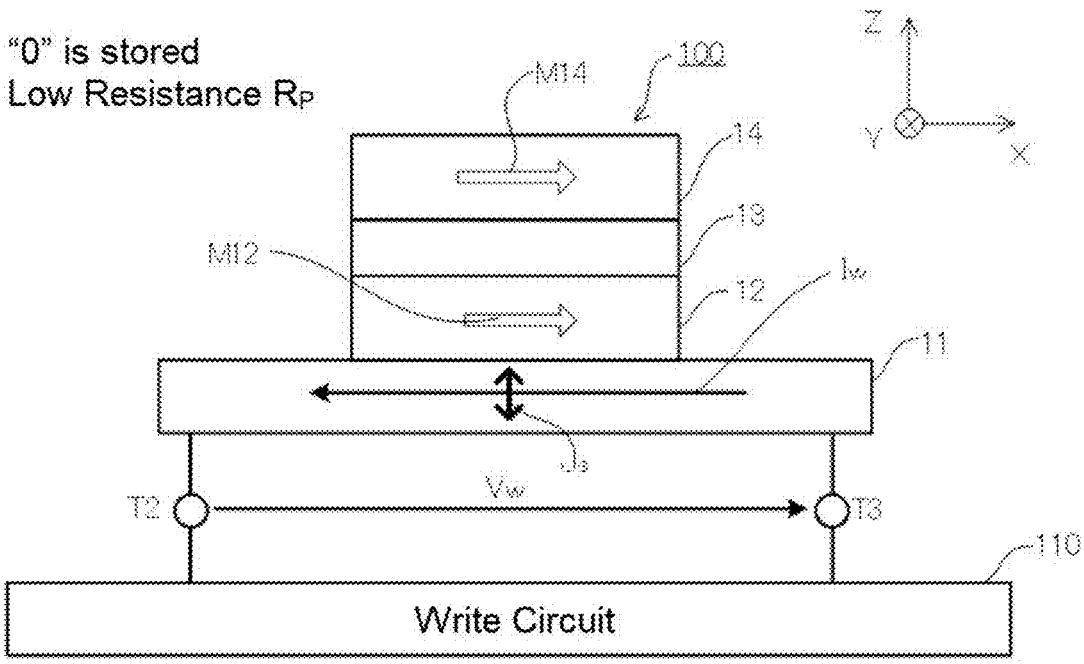
FIGS. 4A-4C are diagrams for explaining an operation to write "1" to a magnetoresistive effect element of an embodiment of the present invention where "0" is stored.

As illustrated in FIG. 4A, the direction of magnetization M12 of the recording layer 12 is the same as the direction of magnetization M14 of the reference layer 14, or the parallel state is achieved. In this case, the magnetoresistive effect element 100 has data "0" saved therein.

Figure 4B:
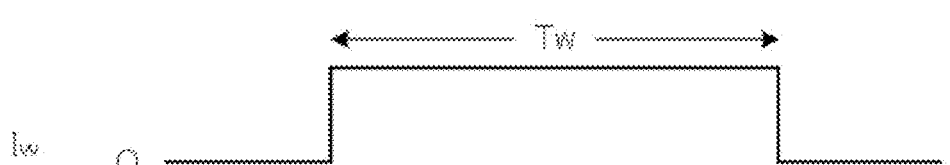
Figure 4C:
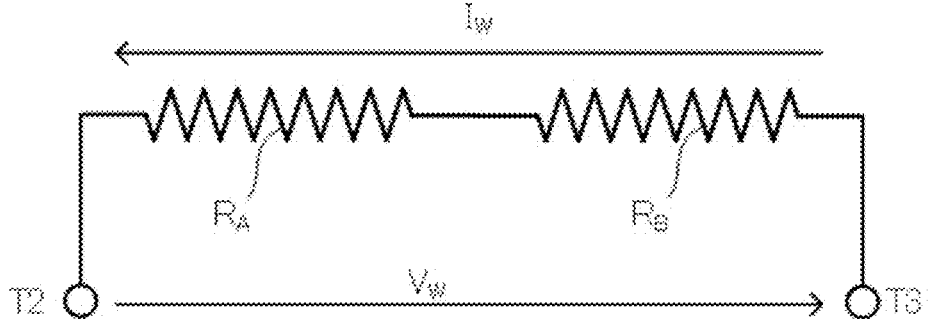
Figure 6:
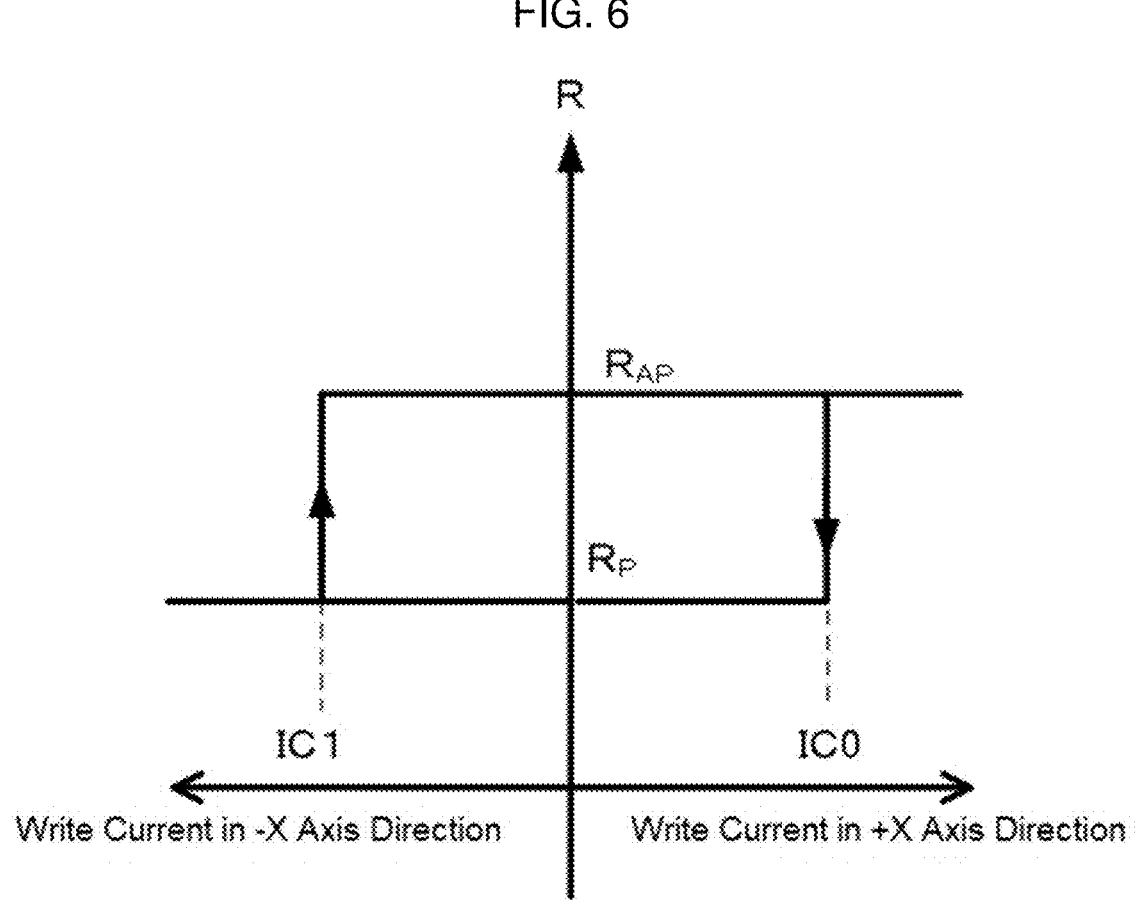
FIG. 6 is a diagram illustrating the relationship between the magnetic resistance and the write current in a magnetoresistive effect element of an embodiment of the present invention.

In writing data "1" to the magnetoresistive effect element 100, the write circuit 110 applies the write voltage +$V_W$ between the second terminal T2 and the third terminal T3 for the pulse width $T_W$ as illustrated in FIG. 4A. As a result, the write current $I_W$ of the pulse width $T_W$ flows through the channel layer 11 in the −X axis direction as illustrated in FIG. 4B. As illustrated in the equivalent circuit of FIG. 4C, the write current $I_W$ flows through the series circuit of the resistance $R_A$ and the resistance $R_B$, and the size thereof is $I_W = V_W/(R_A + R_B)$. The write current $I_W$ is equal to or greater than a threshold value IC1 of the write current $I_W$ of the −X axis direction (FIG. 6), and the pulse width $T_W$ is set to a time period longer than the time required for writing.

As illustrated in FIG. 4A, when the write current $I_W$ flows, a spin flow JS (the flow of spin angular momentum) is generated in the +Z axis direction due to the spin hall effect. This causes uneven distribution of spin, which triggers the spin orbit torque, and because the direction of the magnetization M12 of the recording layer 12 is switched to the −X axis direction, which is opposite to the magnetization M14 of the reference layer 14, the antiparallel state is created. As a result, the resistance value of the circuit from the reference layer 14 to the recording layer 12 becomes high resistance $R_{AP}$. This way, the data "1" is written to the magnetoresistive effect element 100.

Figure 5A:
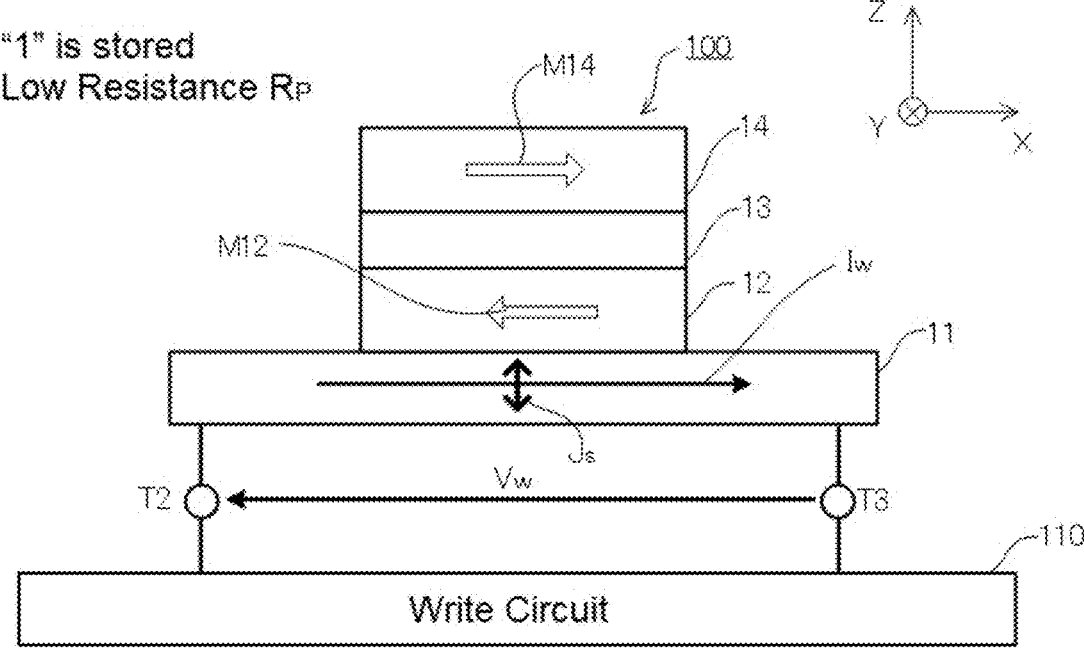
FIGS. 5A-5C are diagrams for explaining an operation to write "0" to a magnetoresistive effect element of an embodiment of the present invention where "1" is stored.
Figure 5B:
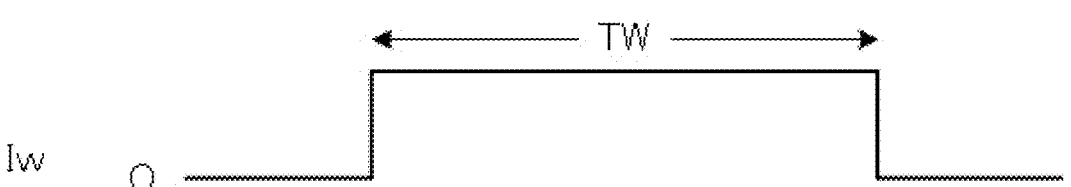
Figure 5C:
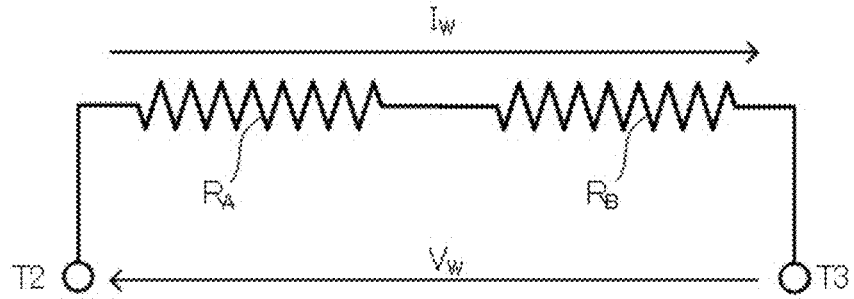

As illustrated in FIG. 5A, in writing data "0" to the magnetoresistive effect element 100 that is in the antiparallel state and that has the data "1" stored therein, the write voltage $+V_W$ is applied between the third terminal T3 and the second terminal T2 for the pulse width $T_W$. As a result, the write current $I_W$ of the pulse width $T_W$ flows through the channel layer 11 in the +X axis direction as illustrated in FIG. 5B. As illustrated in the equivalent circuit of FIG. 5C, the write current $I_W$ flows through the series circuit of the resistance $R_A$ and the resistance $R_B$, and the size thereof is $I_W = V_W/(R_A + R_B)$. The write current $I_W$ is equal to or greater than a threshold value IC0 of the write current $I_W$ of the +X axis direction (FIG. 6), and the pulse width $T_W$ is set to a time period longer than the time required for overwriting.

When the write current $I_W$ flows, the spin flow JS is generated due to the spin hall effect and the like, causing direction of the magnetization M12 of the recording layer 12 to switch to the +X axis direction, which is the same as the magnetization M14 of the reference layer 14 as illustrated in FIG. 4A. As a result, the resistance value of the circuit from the reference layer 14 to the recording layer 12 becomes low resistance $R_P$. This way, the data "0" is written to the magnetoresistive effect element 100.

Next, the operation to read data out of the magnetoresistive effect element 100 will be explained.

Figure 7A:
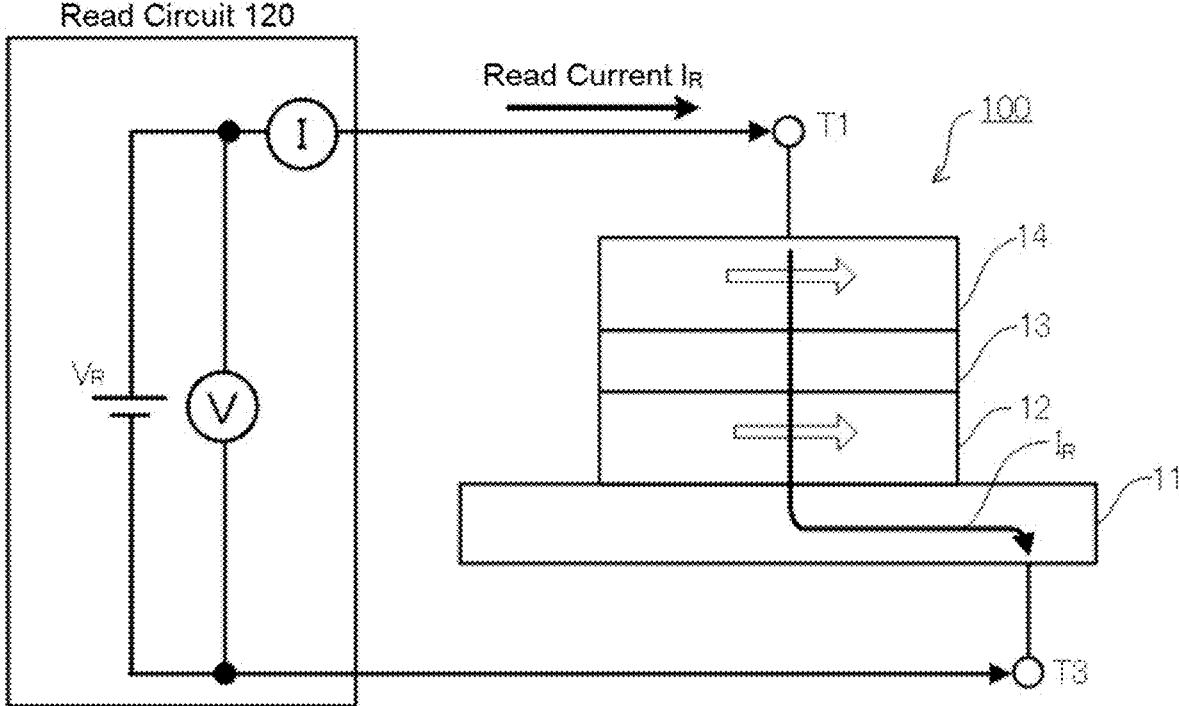
FIGS. 7A and 7B are diagrams for explaining an operation to read data out of a magnetoresistive effect element according to an embodiment of the present invention.
Figure 8A:
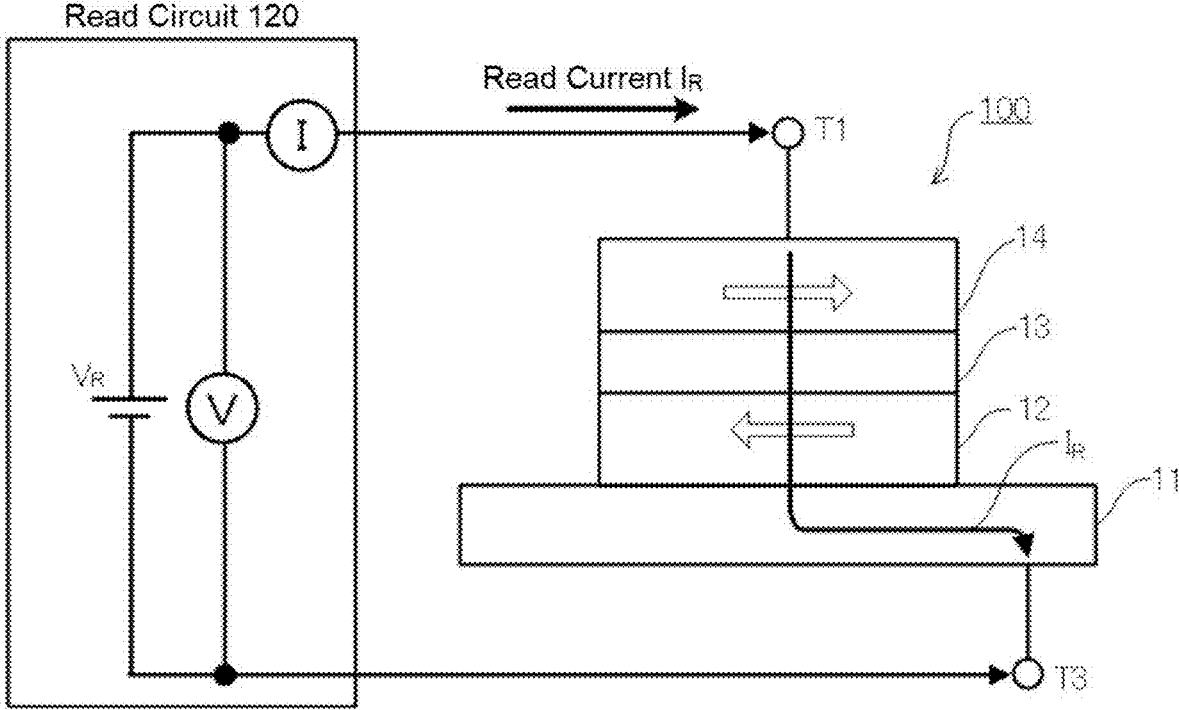
FIGS. 8A and 8B are diagrams for explaining an operation to read data out of a magnetoresistive effect element according to an embodiment of the present invention.

First, as illustrated in FIGS. 7A and 8A, the first terminal T1 and the third terminal T3 of the magnetoresistive effect element 100 are connected to a read circuit 120.

First, as illustrated in FIG. 7A, the parallel state where the direction of magnetization M12 of the recording layer 12 is the same as the direction of magnetization M14 of the reference layer 14 is created. In this case, the resistance of the circuit from the recording layer 12 to the reference layer 14 (current path) is low resistance $R_P$, and the magnetoresistive effect element 100 has "0" stored therein.

Figure 7B:
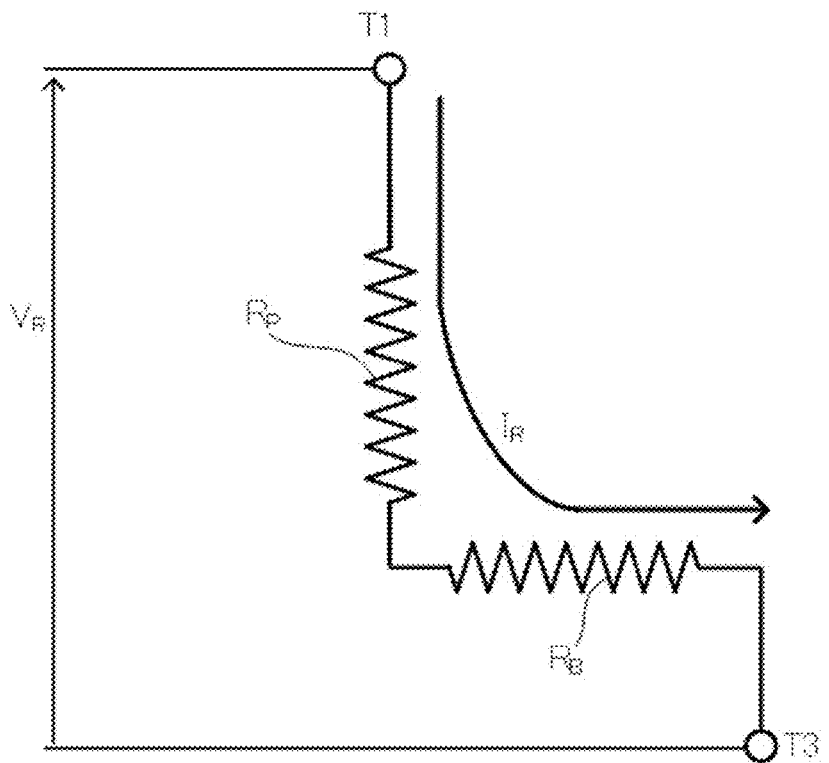

The read circuit 120 applies a read voltage $V_R$ between the third terminal T3 and the first terminal T1, and finds the resultant read current $I_R$. As shown in the equivalent circuit of FIG. 7B, the read current $I_R$ is represented by the following formula:

$$I_R = V_R/(R_P + R_B)$$

On the other hand, in the state of FIG. 8A, the direction of magnetization M12 of the recording layer 12 is −X axis direction and the direction of magnetization M14 of the reference layer 14 is the +X axis direction (antiparallel state). Thus, the resistance of the current path from the recording layer 12 to the reference layer 14 is high resistance $R_{AP}$, and the magnetoresistive effect element 100 has "1" stored therein.

Figure 8B:
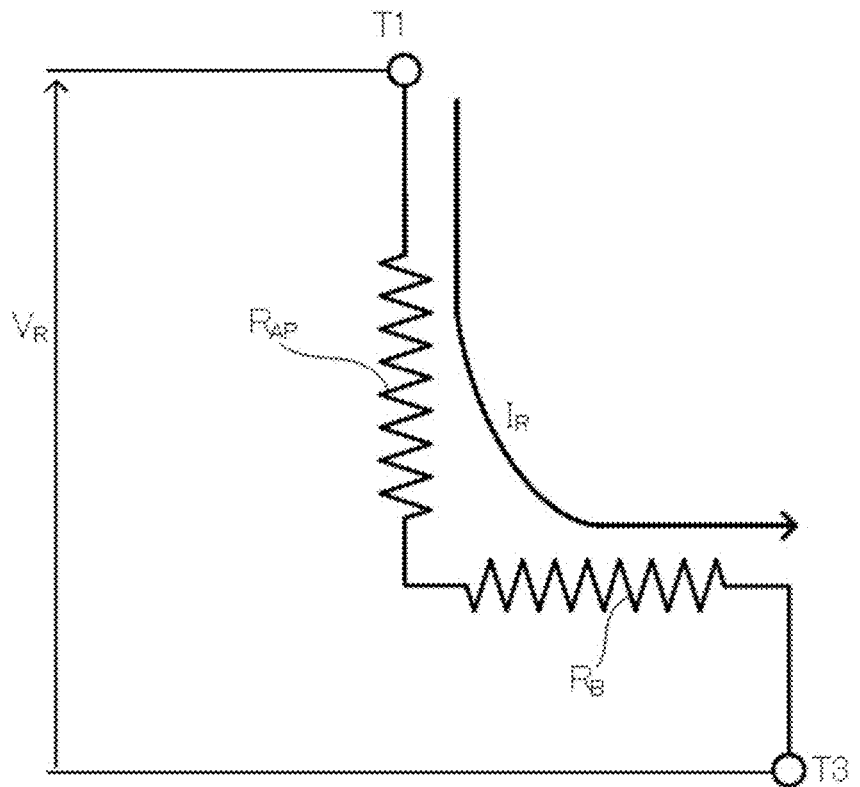

The read circuit 120 applies the read voltage $V_R$ between the third terminal T3 and the first terminal T1, and finds the resultant read current $I_R$. As shown in the equivalent circuit of FIG. 8B, the read current $I_R$ is represented by the following formula:

$$I_R = V_R/(R_{AP} + R_B)$$

The read circuit 120 compares the read current $I_R$ with a prescribed reference current Is that is set in advance, and if the read current $I_R$ is greater than the reference current Is, it is determined that the read-out data is 0, and if the read current $I_R$ is smaller than the reference current Is, it is determined that the read-out data is 1.

Figure 9A:
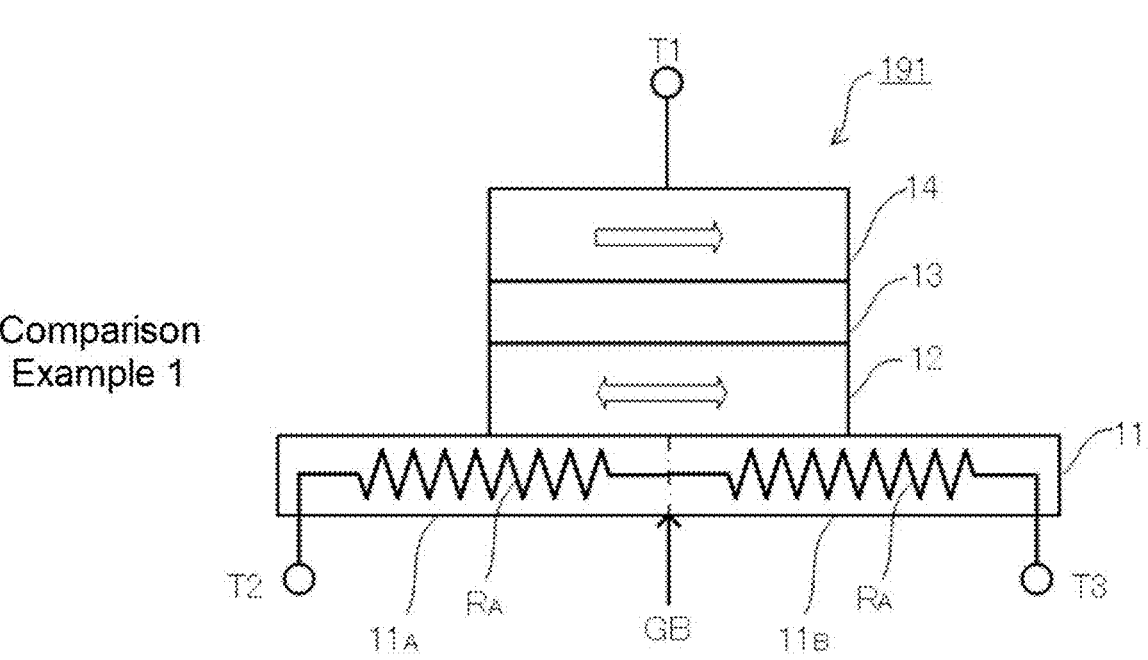
FIGS. 9A and 9B are diagrams for explaining magnetoresistive effect elements of Comparison Examples 1 and 2.
Figure 9B:
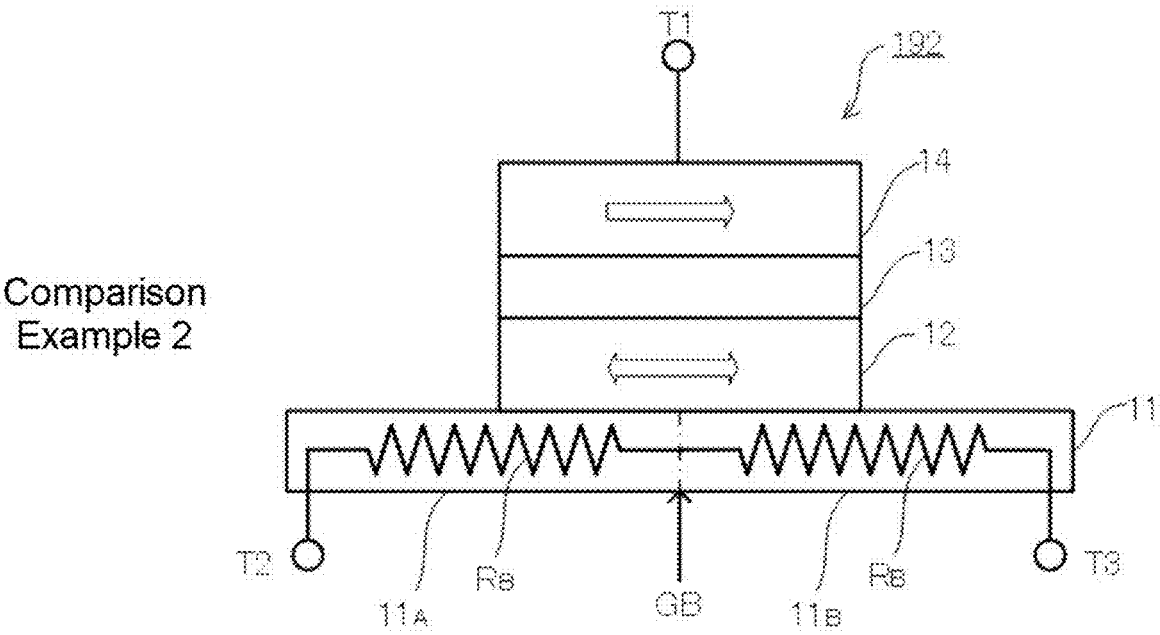

Here, as illustrated in FIGS. 9A and 9B, MRAM 191 where both the first channel layer 11A and the second channel layer 11B have high resistance $R_A$ (Comparison Example 1), and MRAM 192 where both the first channel layer 11A and the second channel layer 11B have both low resistance $R_B$ (Comparison Example 2) will be discussed. Resistance $R_A = \alpha \cdot R_B$, where $\alpha$ is a real number greater than 1.

The write current $I_W$ will be compared between respective cases.

In an embodiment of the present invention, the write current $I_W$ is represented by Formula (1):

$$I_W = V_W/(R_A + R_B) = V_W/[(\alpha+1)R_B] \tag{1}$$

In Comparison Example 1, the write current $I_W$ is represented by Formula (2):

$$I_W = V_W/(R_A + R_B) = V_W/(2 \cdot \alpha \cdot R_B) \tag{2}$$

In Comparison Example 2, the write current $I_W$ is represented by Formula (3):

$$I_W = V_W/(R_A + R_B) = V_W/(2 \cdot R_B) \tag{3}$$

Formula (1) indicates that, in the magnetoresistive effect element 100 of an embodiment of the present invention, the write current $I_W$ can be set to an appropriate size that is not too large or too small by appropriately adjusting a. This makes it possible to prevent the write time $T_W$ from getting longer. Thus, high-speed writing is achieved without increasing power consumption.

On the other hand, Formula (2) indicates that, in Comparison Example 1, the write current $I_W$ is suppressed, but because the write current $I_W$ is too small, data writing might fail, or it might take longer for data writing to complete.

Also, Formula (3) indicates that, in Comparison Example 2, the write current $I_W$ cannot be suppressed, which makes it difficult to reduce the power consumption.

Next, the read current $I_R$ will be compared between respective cases.

In an embodiment of the present invention, the read current $I_R$ is represented by Formulas (4) and (5):

$$I_R = V_R/(R_{AP} + R_B), \text{ where data is "1"} \tag{4}$$

$$I_R = V_R/(R_P + R_B), \text{ where data is "0"} \tag{5}$$

In Comparison Example 1, the read current $I_R$ is represented by Formulas (6) and (7):

$$I_R = V_R/(R_{AP} + R_A) = V_R/(R_{AP} + \alpha \cdot R_B), \text{ where data is "1"} \tag{6}$$

$$I_R = V_R/(R_P + R_A) = V_R/(R_P + \alpha \cdot R_B), \text{ where data is "0"} \tag{7}$$

In Comparison Example 2, the read current $I_R$ is represented by Formulas (8) and (9):

$$I_R=V_R/(R_{AP}+R_B), \text{ where data is "1"} \tag{8}$$

$$I_R=V_R/(R_P+R_B), \text{ where data is "0"} \tag{9}$$

Formulas (4) to (9) suggest that an embodiment of the present invention and Comparison Example 2 have a relatively large read current $I_R$, which allows for high-speed reading. On the other hand, in Comparison Example 1, the read current $I_R$ is small, which may extend the reading time.

Next, the TMR ratio will be compared between respective cases.

In an embodiment of the present invention, the TMR ratio is represented by Formula (10):

$$TMR=[(R_{AP}+R_B)-(R_P+R_B)]/(R_P+R_B)=(R_{AP}-R_P)/(R_P+R_B) \tag{10}$$

The TMR ratio of Comparison Example 1 is represented by Formula (11):

$$TMR=[(R_{AP}+R_A)-(R_{AP}+R_A)]/(R_P+R_A)=(R_{AP}-R_P)/(R_P+R_A)=(R_{AP}-R_P)/(R_P+\alpha \cdot R_B) \tag{11}$$

The TMR ratio of Comparison Example 2 is represented by Formula (12):

$$TMR=[(R_{AP}+R_B)-(R_P+R_B)]/(R_P+R_B)=(R_{AP}-R_P)/(R_P+R_B) \tag{12}$$

Formulas (10) to (12) suggest that an embodiment of the present invention and Comparison Example 2 have a relatively large TMR ratio, which makes it easier to identify data and allows for high-speed reading. On the other hand, in Comparison Example 1, since the TMR ratio is relatively small, it is difficult to identify data, which may increase the read time.

Based on the findings of the study, in the magnetoresistive effect element 100 of an embodiment of the present invention, by appropriately setting the resistance $R_A$ of the first channel layer 11A and the resistance $R_B$ of the second channel layer 11B, high-speed writing is achieved without increasing the write current $I_W$ low, and high-speed reading is also possible.

The magnetoresistive effect element of this embodiment is not limited to the embodiment described above, and various modifications and applications are possible.

For example, in the embodiment described above, the first channel layer 11A and the second channel layer 11B were separated at the center of gravity CG of the junction area of the recording layer 12 and the channel layer 11, but the dividing position may be appropriately modified as long as the following points are fulfilled: (i) overall, the channel layer 11 has an resistance value necessary for keeping the write current $I_W$ low; and (ii) the resistance value of an area of the channel layer 11 where the read current $I_R$ flows through is smaller than the resistance value of an area where the read current $I_R$ does not flow through.

The resistance value $(R_A+R_B)$ of the channel layer 11 necessary to attain the appropriate write current $I_W$ may be found through experiments or simulation. As for the resistance value of the area of the channel layer 11 where the read current $I_R$ flows through, an appropriate resistance value $R_B$ that results in appropriate read current $I_R$ and TMR ratio may be found through experiments or simulation.

In the embodiment described above, the first terminal T1 and the third terminal T3 were used for data reading, but the second terminal T2 may also be used for data reading. It is also possible to conduct data reading through the second terminal T2 and data reading through the third terminal T3 at the same time, i.e., dual port memory. However, in this case, in data reading through the second terminal T2, the read current $I_R$ is smaller than that in data reading through the third terminal T3, and therefore, appropriate signal processing would be necessary.

Next, a configuration example of a memory circuit that uses as a memory cell the magnetoresistive effect element 100 having the configuration described above will be explained with reference to FIG. 10A.

Figure 10A:
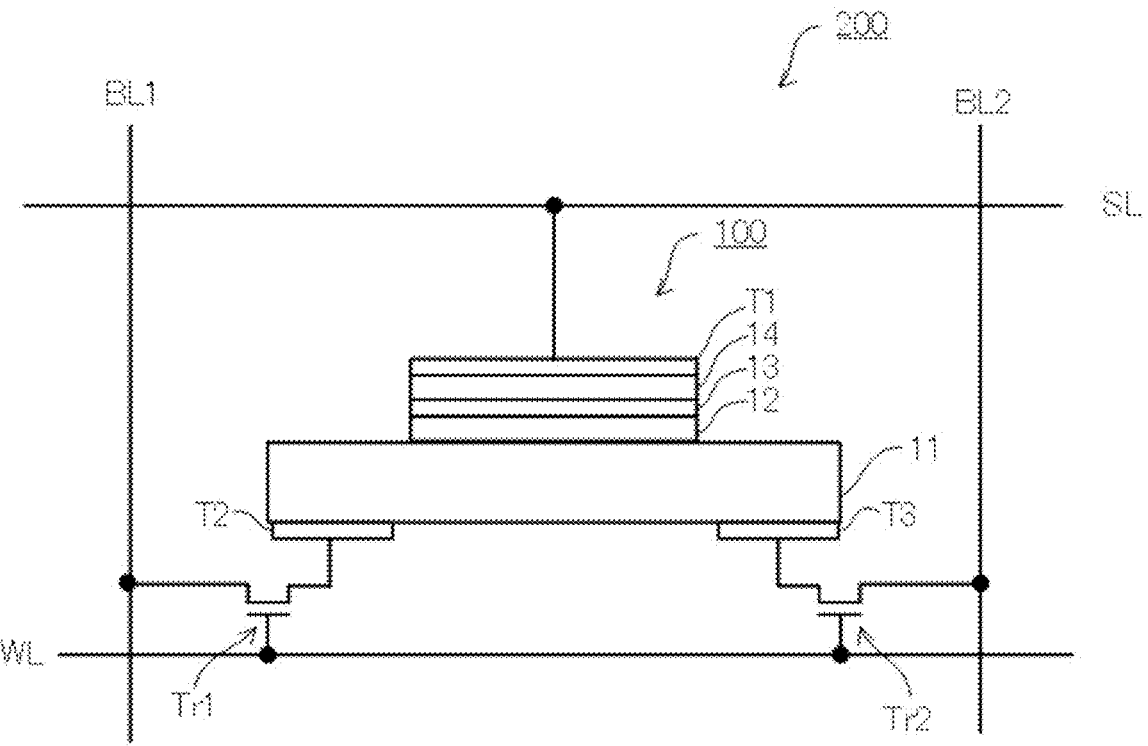
FIGS. 10A and 10B are circuit diagrams of a memory cells circuit using a magnetoresistive effect element of an embodiment of the present invention as a storage cell.

FIG. 10A illustrates the configuration of a memory cell circuit 200 for one bit.

The memory cell circuit 200 includes a magnetoresistive effect element 100 constituting a memory cell for one bit, a pair of bit lines BL1 and BL2, a word line WL, a source line SL, a first selector transistor Tr1, and a second selector transistor Tr2.

The first terminal T1 of the magnetoresistive effect element 100 is connected to the source line SL. The second terminal T2 is connected to the drain of the first selector transistor Tr1, and the third terminal T3 is connected to the drain of the second selector transistor Tr2. The gate electrodes of the first selector transistor Tr1 and the second selector transistor Tr2 are commonly connected to the word line WL. The source of the first selector transistor Tr1 is connected to the first bit line BL1, and the source of the second selector transistor Tr2 is connected to the second bit line BL2.

In order to write data to the magnetoresistive effect element 100, first, an active level signal is applied to the word line WL to turn on the selector transistors Tr1 and Tr2 to select the magnetoresistive effect element 100. In this example, the selector transistors Tr1 and Tr2 are constituted of N-channel MOS transistors, and the word line WL is set to a high level. This turns on the first selector transistor Tr1 and the second selector transistor Tr2. Then, depending on the data to be written, one of the first bit line BL1 and the second bit lint BL2 is set to the high level, and the other is set to the ground level.

Specifically, when data "1" is to be written, the first bit line BL1 is set to the low level, and the second bit line BL2 is set to the high level. This causes the write current $I_W$ to flow in the −X axis direction as illustrated in FIG. 4A, and data "1" is written as a result.

On the other hand, when data "0" is to be written, the first bit line BL1 is set to the high level, and the second bit line BL2 is set to the low level. This causes the write current $I_W$ to flow as illustrated in FIG. 5A, and data "0" is written as a result. Bit data is written to the magnetoresistive effect element 100 in this way.

On the other hand, in order to read information stored in the magnetoresistive effect element 100, the word line WL is set to the active level to turn on the first selector transistor Tr1 and the second selector transistor Tr2. The bit line BL1 is set to an open state, and the bit line BL2 is set to the low (ground) level. The read voltage $V_R$ is applied to the source line SL. As a result, the read current $I_R$ flows from the source line SL to the second bit line BL2 via the first terminal T1, the reference layer 14 to the channel layer 11, the third terminal T3, and the second selector transistor Tr2. By comparing the read current $I_R$ with the reference current Is through a not-shown op-amplifier and the like, the stored data is obtained.

The circuit configuration and operation described above is one example, and may appropriately be modified.

Figure 10B:
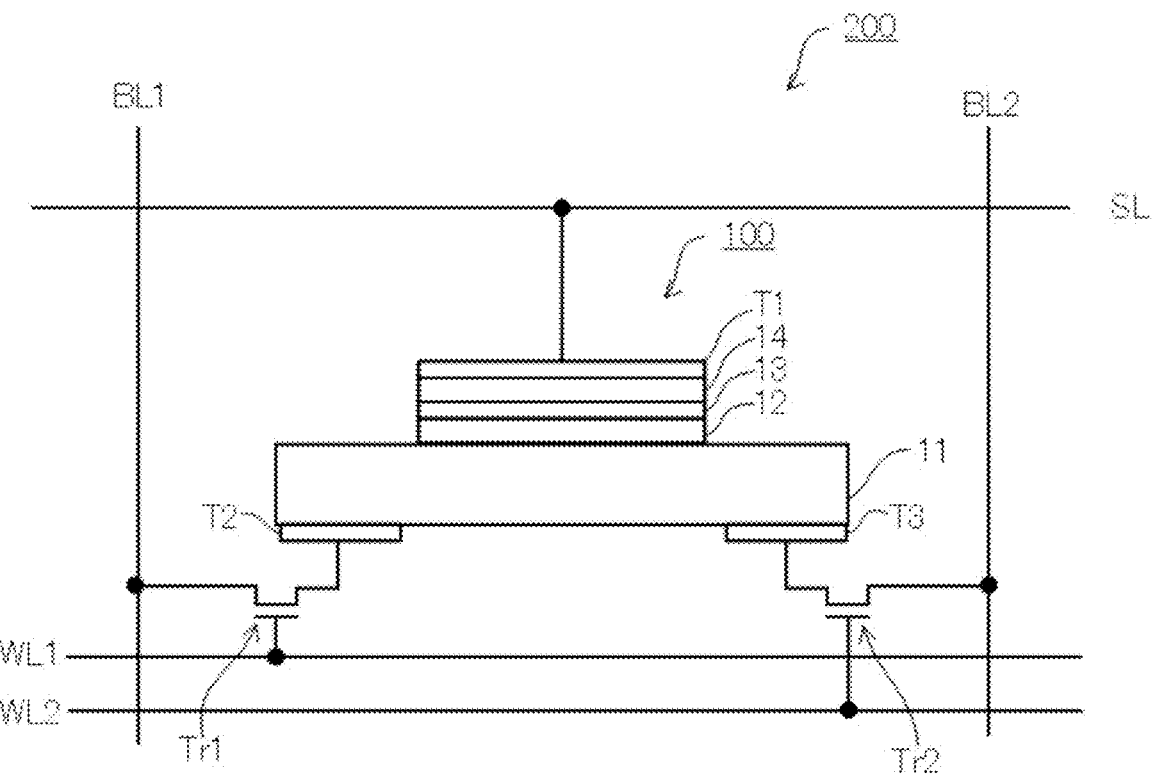

For example, if the magnetoresistive effect element 100 is used as dual port memory, as illustrated in FIG. 10B, the gate of the first selector transistor Tr1 may be connected to the first word line WL1, and the gate of the second selector transistor Tr2 may be connected to the second word line WL2. In this configuration, by driving the first word line WL1 and the second word line WL2 independently of each other, data reading through the second terminal T2 and data reading through the third terminal T3 may be performed individually and in parallel. In this case, for data reading through the third terminal T3, relatively large read current $I_R$ and TMR ratio are attained as described above.

On the other hand, in data reading through the second terminal T2, the load resistance $R_A$ is relatively large. However, in dual port memory, it is common that each port has a different load resistance, and it is preferable to adopt a circuit configuration that can handle each load resistance.

Figure 11:
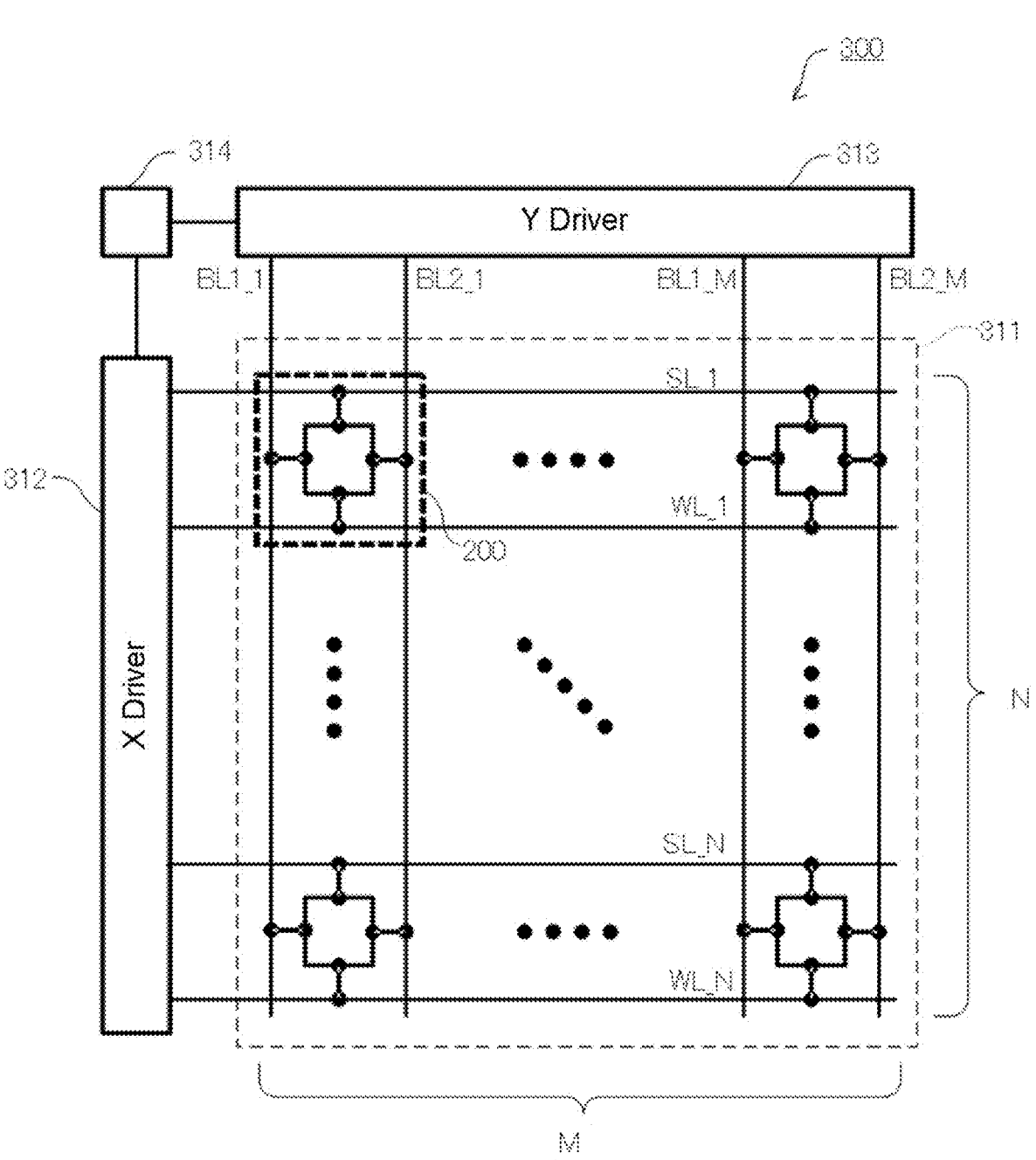
FIG. 11 is a block diagram of a magnetic memory device equipped with a plurality of the memory cell circuits of FIG. 10.

Next, with reference to FIG. 11, a configuration of a magnetic memory device 300 that includes a plurality of memory cell circuits 200 illustrated in FIGS. 10A and 10B will be explained.

As illustrated in the figure, the magnetic memory device 300 includes a memory cell array 311, an X driver 312, a Y driver 313, and a controller 314. The memory cell array 311 has memory cell circuits 200 arranged in an array of N rows and M columns. The memory cell circuit 200 of each column is connected to a pair of first bit line BL1 and second bit line BL2 of the corresponding column. The memory cell circuit 200 of each row is connected to the word line WL and the source line SL of the corresponding row. The X driver 312 and the Y driver 313 are selector circuits for selecting a memory cell.

The X driver 312 is connected to a plurality of word lines WL and source lines SL, decodes a row address, and drives the word line of the row to be accessed to the active level. The X driver 312 also sets the voltage of the source line SL for required operations. For ease of illustration, there is only one word line WL illustrated, but in the configuration of FIG. 10B, two word lines are provided.

The Y driver 313 is connected to a plurality of first bit lines BL1 and second bit lines BL2, decodes a column address, and brings the first bit line BL1 and the second bit line BL2 connected to the memory cell circuit 200 to be accessed to a data writing state or data reading state for desired data. Further, when reading data stored in the memory cell circuit 200, the Y driver 313 sets the first bit line BL1 to an open state and the second bit line BL2 to the low level, compares the read current flowing through the bit lines BL1 and BL2 with the reference current to identify the resistance of the memory cell circuit 200 of each column, and retrieves stored data.

The controller 314 controls the X driver 312 and the Y driver 313 individually for data writing or data reading.

Each magnetoresistive effect element 100 has a small bit line driving capacity for data reading. Thus, as illustrated in FIG. 11, if a plurality of magnetoresistive effect elements 100 are connected to one bit line BL, it takes longer for one magnetoresistive effect element 100, which is to be read, to drive the bit line BL (wire driving time) $t_{cir}$, which might affect the access speed. This becomes more pronounced as the number of magnetoresistive effect elements 100 connected to one bit line BL increases.

Figure 12:
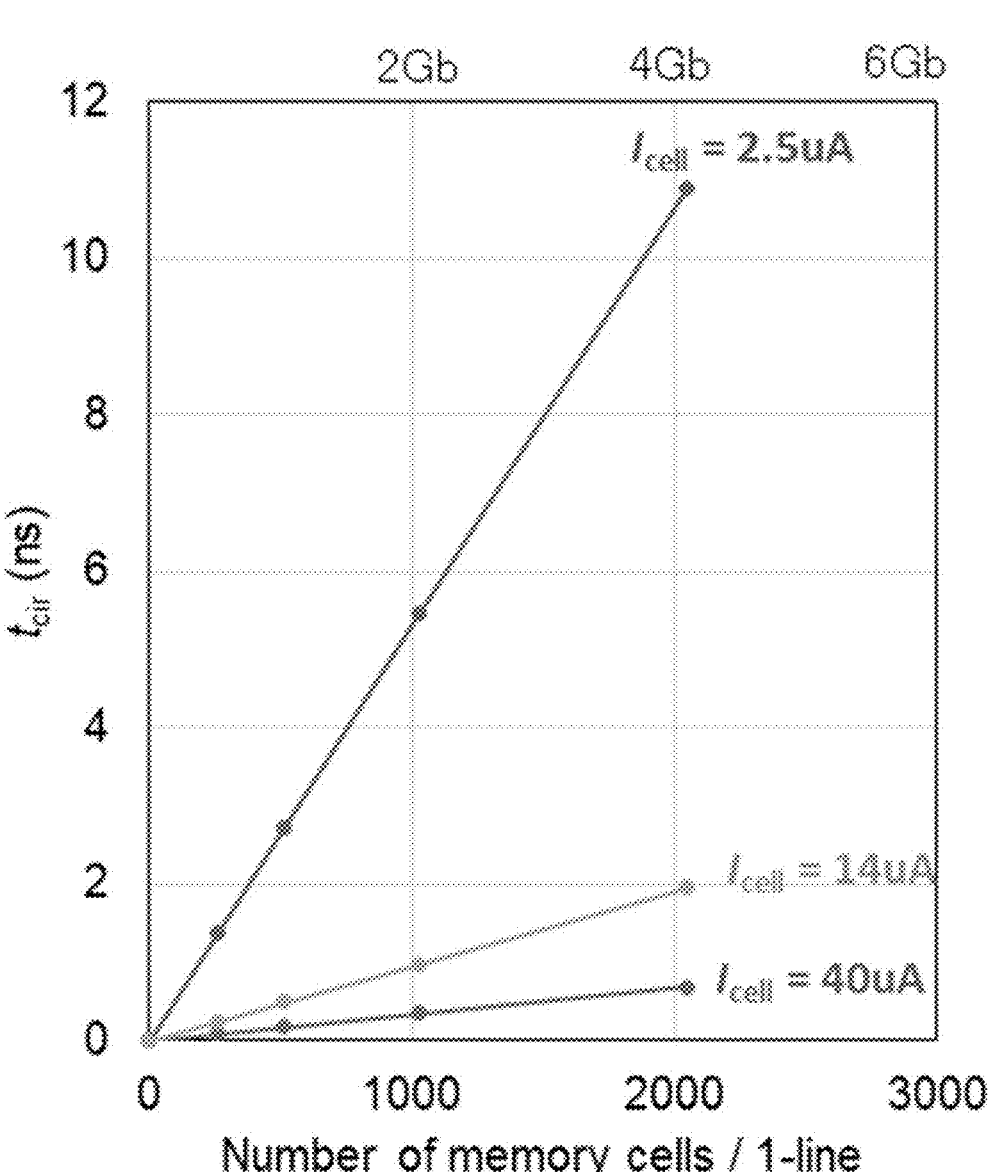
FIG. 12 is a diagram for explaining a wire driving time of the memory cell circuit of FIG. 11.

FIG. 12 illustrates a typical relationship between the number of magnetoresistive effect elements 100 connected to one bit line, the total capacity, the wire driving time $t_{cir}$, and the current $I_{cell}$ that flows the magnetoresistive effect element 100.

This graph is based on the following formula:

$t_{cir} = C \times V_{cell}/I_{cell}$ ($C$ represents the capacity of one bit line (wire capacity))

The wire capacity C can be found from "the wire capacity per unit length of a bit line"דthe length required to connect the magnetoresistive effect element 100". In this example, the wire capacity per unit length of a bit line is 208 aF ($=208\times10^{-18}$ F)/μm. This is based on "International Roadmap for Devices and Systems (TRDS) 2018 Update". Hypothetically, the cell size of the magnetoresistive effect element 100 is 4 F×4 F=16 $F^2$, F=40 nm. This represents a circuit that can accommodate two wires each in the X axis direction and Y axis direction per one memory cell, which coincides with the configuration illustrated in FIG. 10. The length of the bit line can be found by "4F×the number of connected memory cells".

$V_{cell}$ is the voltage of the bit line BL set by the magnetoresistive effect element 100 in the antiparallel state, and $V_{cell}$ is 0.8V in this case. $I_{cell}$ is the value of read current that flows through the magnetoresistive effect element 100.

As FIG. 12 suggests, as long as the read current $I_{cell}$ is 14 μA, even when the number of memory cells per bit line is approximately 500 and the bit size is approximately 1 Gbit, it is possible to achieve the wire driving time $t_{cir}$ of about 0.5 ns.

The resistance $R_P$ of a magnetoresistive effect element in the approximate parallel state is about 14,000Ω, and the resistance $R_{AP}$ of a magnetoresistive effect element in the antiparallel state is about 34,000Ω. Thus, from 0.8/34,000, the read current $I_{cell}$ is 23.5 μA. This means that according to an embodiment of the present invention, it is possible to achieve high-speed reading with the wire driving time $t_{cir}$ being 0.5 ns or shorter as well as lower power consumption.

Next, an example of the specific structure to make the resistance value $R_A$ of the first channel layer 11A differ from the resistance value $R_B$ of the second channel layer 11B will be explained with reference to FIGS. 13 to 17. In FIGS. 13 to 17, the recording layer 12 to reference layer 14 will simply be referred to as MTJ.

Configuration Example 1

Figure 13A:
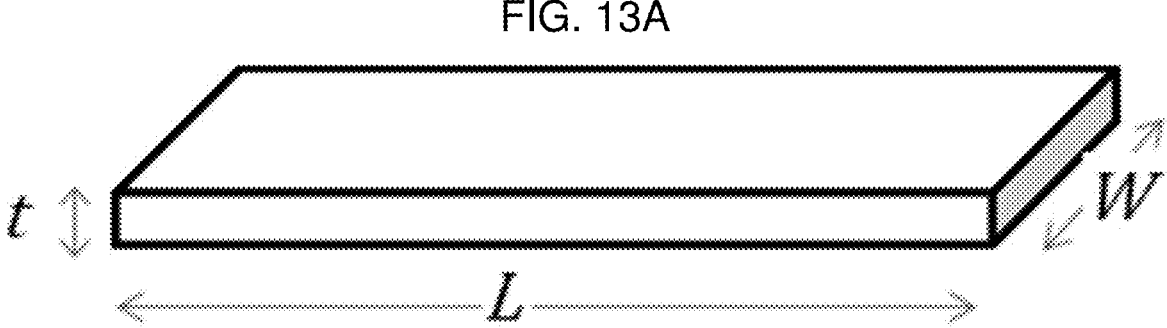
FIGS. 13A and 13B are diagrams illustrating Configuration Example 1 of the first channel layer and the second channel layer of FIG. 3.

The length L, thickness t and width W of a thin film are defined as in FIG. 13A.

In this case, the resistance value R of a thin film is represented by R=ρ·L/(t·W), where ρ is a resistance rate (Ω·m), L is the length of thin film (m), t is the thickness of thin film (m), and W is the width of thin film (m).

This applies to other configuration examples.

Figure 13B:
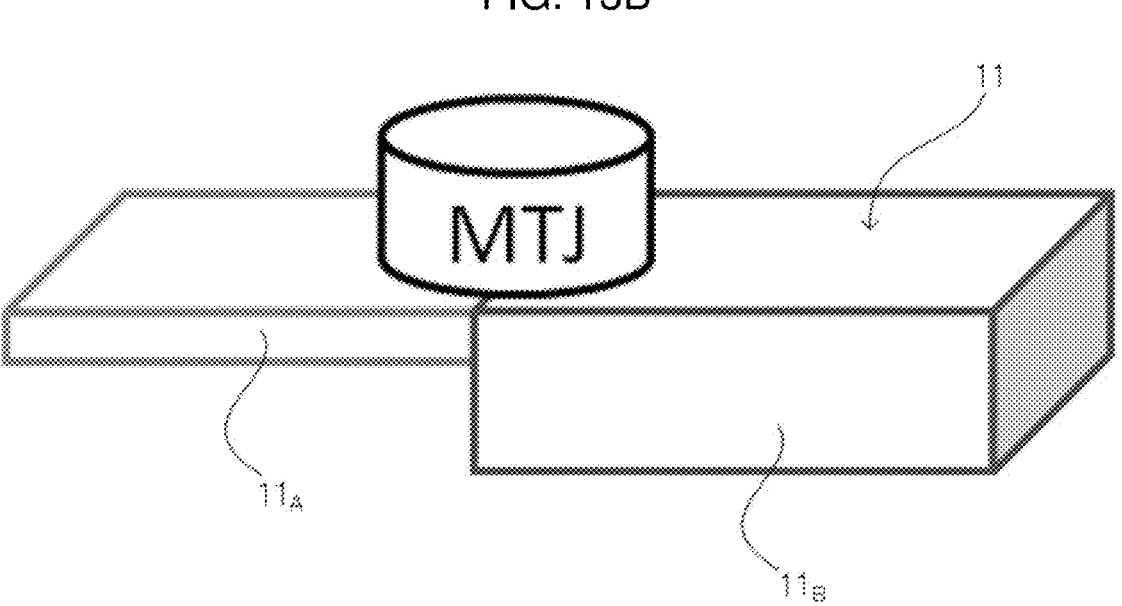

As illustrated in FIG. 13B, by making the first channel layer 11A thinner and the second channel layer 11B thicker so that the thickness t differs from each other, it is possible to make the channel layer 11 have several regions with differing resistance values.

The first channel layer 11A and the second channel layer 11B may be formed to have different thicknesses by forming a base layer that have different surface levels, depositing a heavy metal on top of this base layer through sputtering, planarizing the surface of the deposited layer, and patterning the layer thereafter.

Configuration Example 2

Figure 14A:
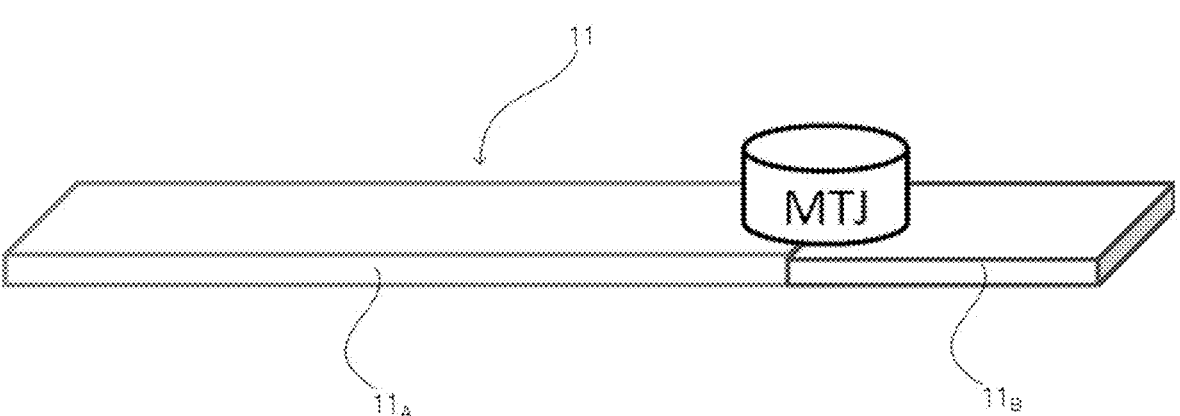
FIGS. 14A and 14B are diagrams illustrating Configuration Example 2 of the first channel layer and the second channel layer of FIG. 3.
Figure 14B:
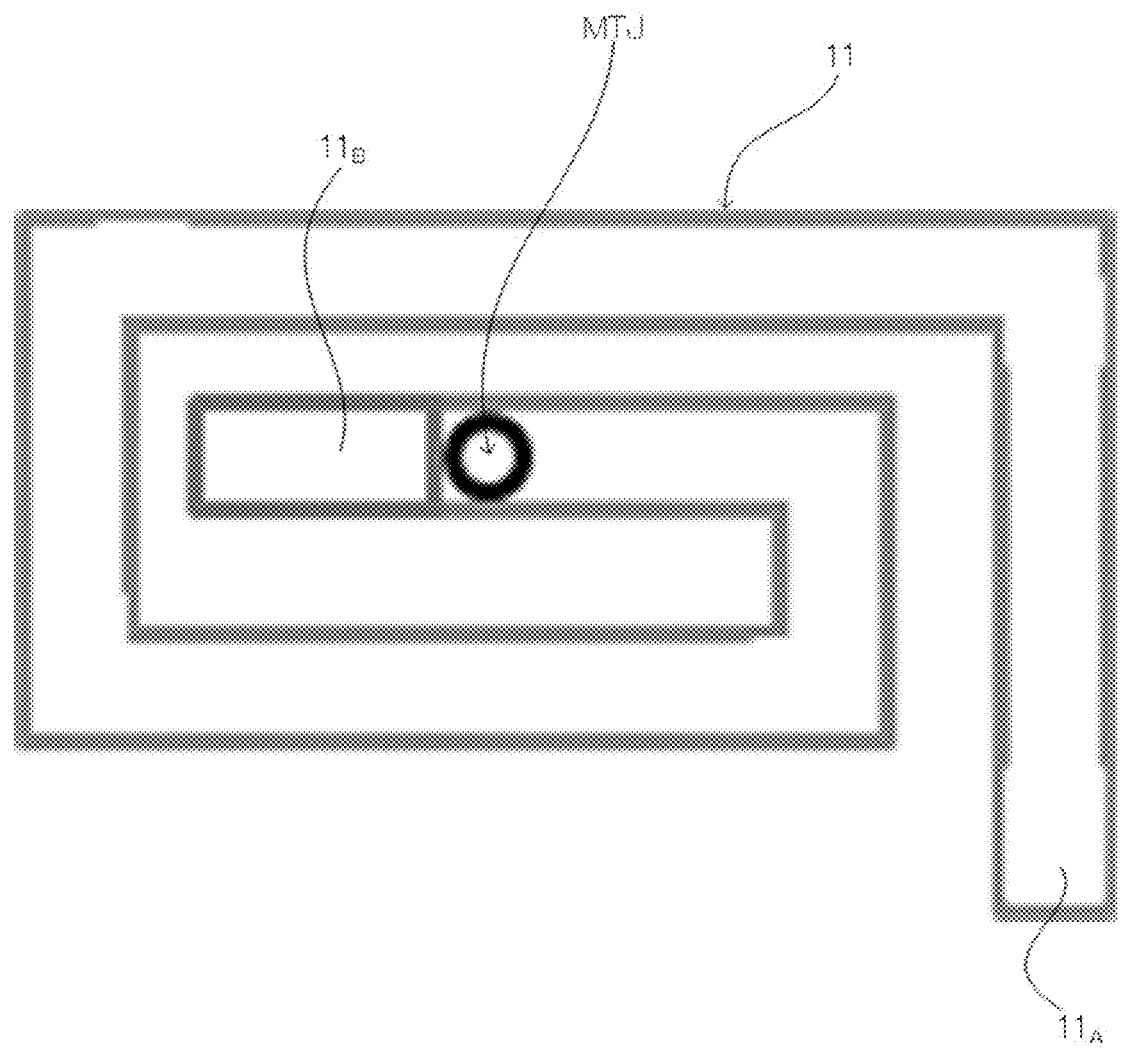

As illustrated in FIG. 14A, by making the first channel layer 11A longer and the second channel layer 11B shorter so that the length L differs from each other, it is possible to make the channel layer 11 have several regions with differing resistance values. It is not necessary to make the first channel layer 11A and the second channel layer 11B in a linear shape, and as long as the necessary length L is secured, any appropriate shapes may be adopted such as a spiral shape as illustrated in FIG. 14B.

Configuration Example 3

Figure 15:
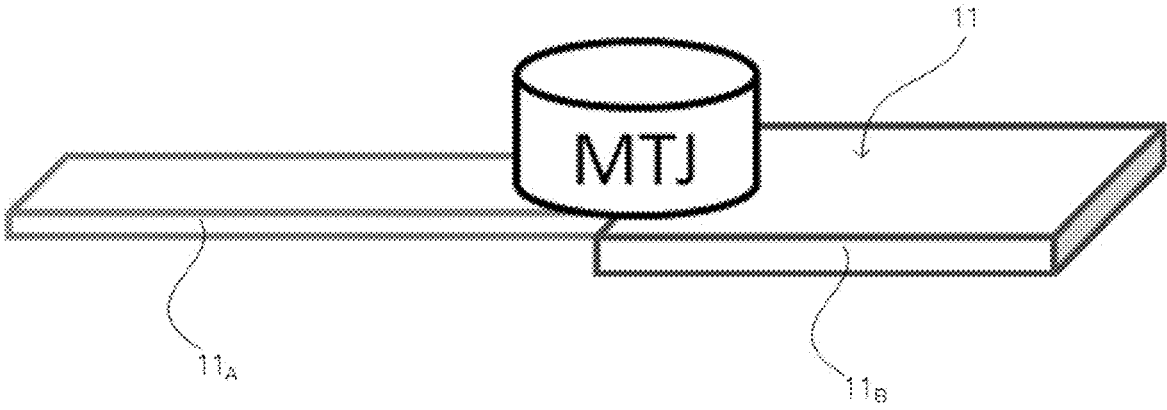
FIG. 15 is a diagram illustrating Configuration Example 3 of the first channel layer and the second channel layer of FIG. 3.

As illustrated in FIG. 15, by making the first channel layer 11A narrower and the second channel layer 11B wider, it is possible to make the channel layer 11 having several different widths W.

Configuration Example 4

Figure 16:
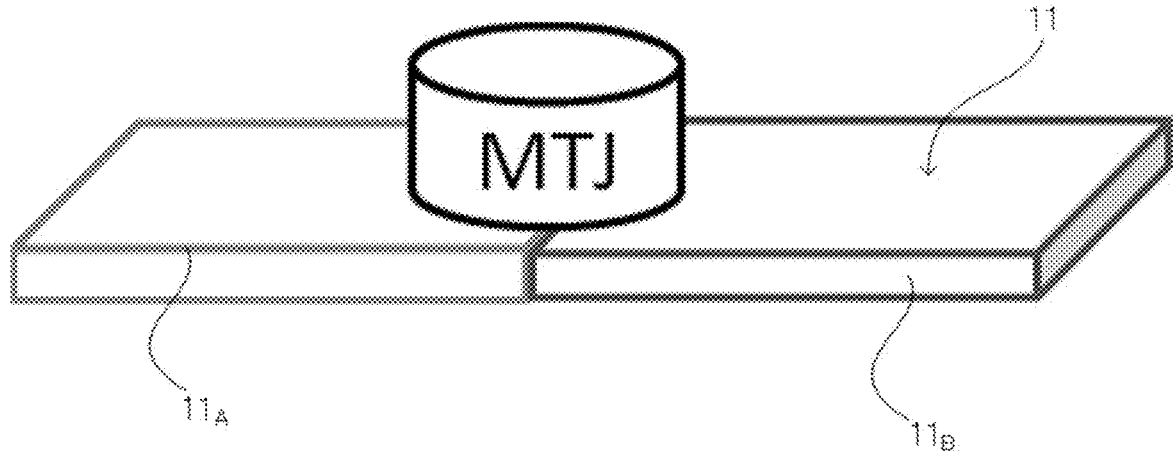
FIG. 16 is a diagram illustrating Configuration Example 4 of the first channel layer and the second channel layer of FIG. 3.

As schematically illustrated in FIG. 16, even when the outer shape of the first channel layer 11A differs from that of the second channel layer 11B, by using different materials for the first channel layer 11A and the second channel layer 11B, it is possible to make the channel layer 11 have differing resistance rates p. In this case, by adjusting the formulation of various heavy metals and additives, appropriate resistance rates are achieved. Examples of the manufacturing method for the channel layer 11 include: i) forming the first channel layer 11A by forming the first heavy metal layer having the resistance rate ρ1 and patterning this layer; ii) forming a mask that covers the first channel layer 11A; iii) forming the second channel layer 11B by depositing the second heave metal having the resistance rate ρ2 to form a heavy metal layer and patterning this layer; and iv) removing the mask.

Configuration Example 5

Figure 17:
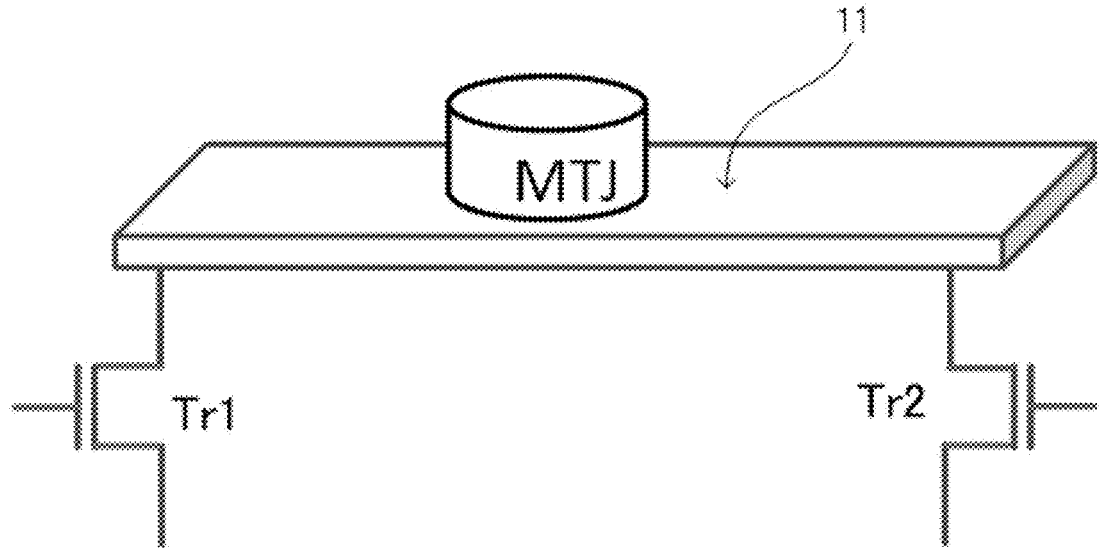
FIG. 17 is a diagram illustrating Configuration Example 5 of the first channel layer and the second channel layer of FIG. 3.

Even when the first channel layer 11A and the second channel layer 11B are the same as each other, the channel layer 11 can be realized by increasing the resistance value of a circuit element connected to the second terminal T2 and decreasing the resistance of a circuit element connected to the third terminal T3. FIG. 17 illustrates an example where the selector transistors Tr1 and Tr2 of FIGS. 10A and 10B, which are examples of the circuit element, are made to have differing ON resistances. As the method for having differing ON resistances, any appropriate method may be adopted such as making the size of the transistors (channel width or channel length) differ from each other, or doping the channel region with impurities.

Configuration Examples 1 to 5 may be combined appropriately.

Figure 18A:
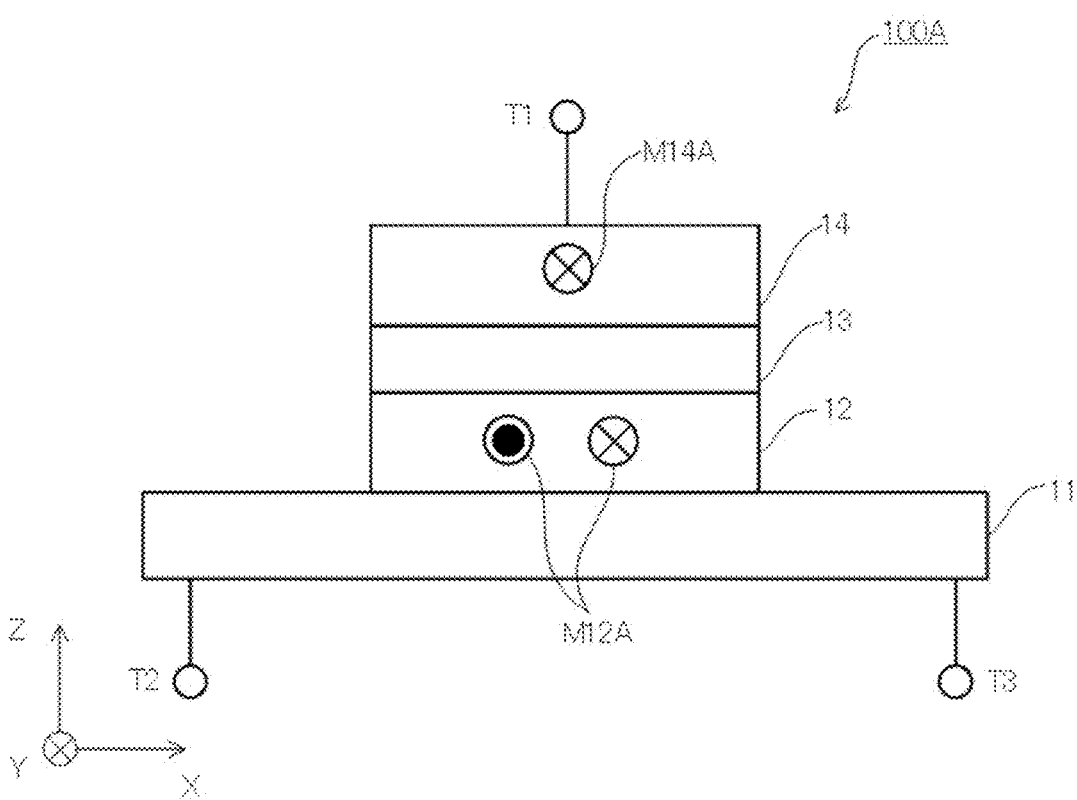
FIGS. 18A and 18B are diagrams illustrating the structure of a modification example of a magnetoresistive effect element of an embodiment of the present invention.
Figure 18B:
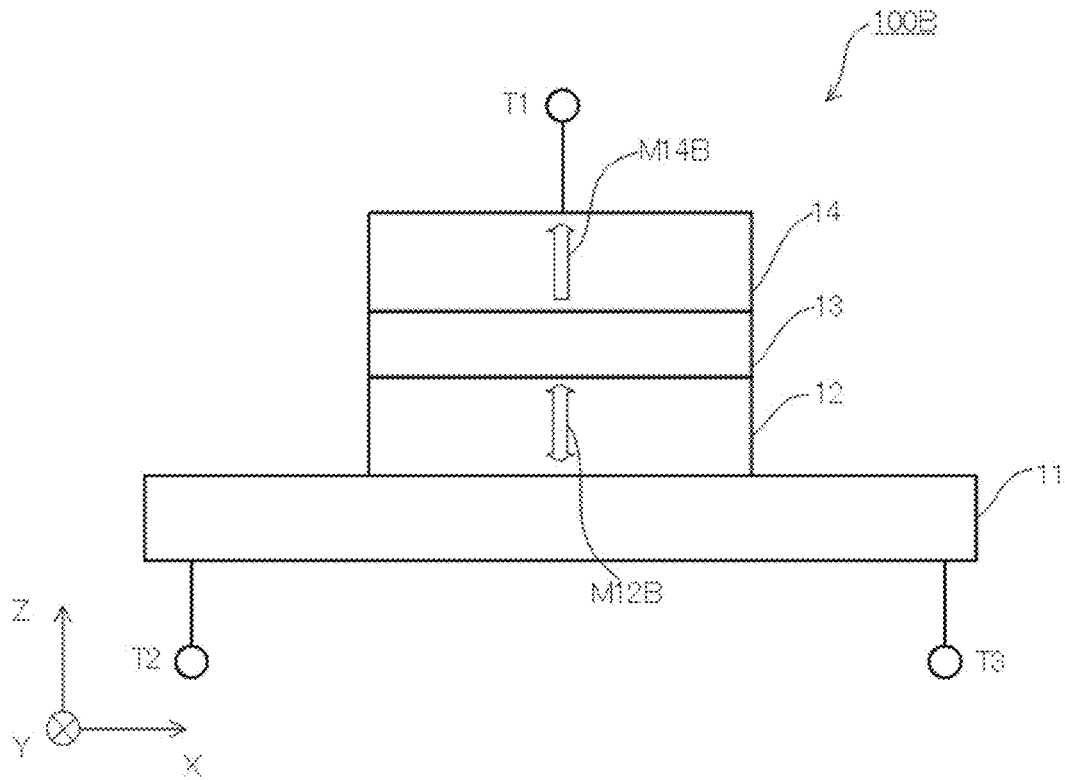
Figure 19:
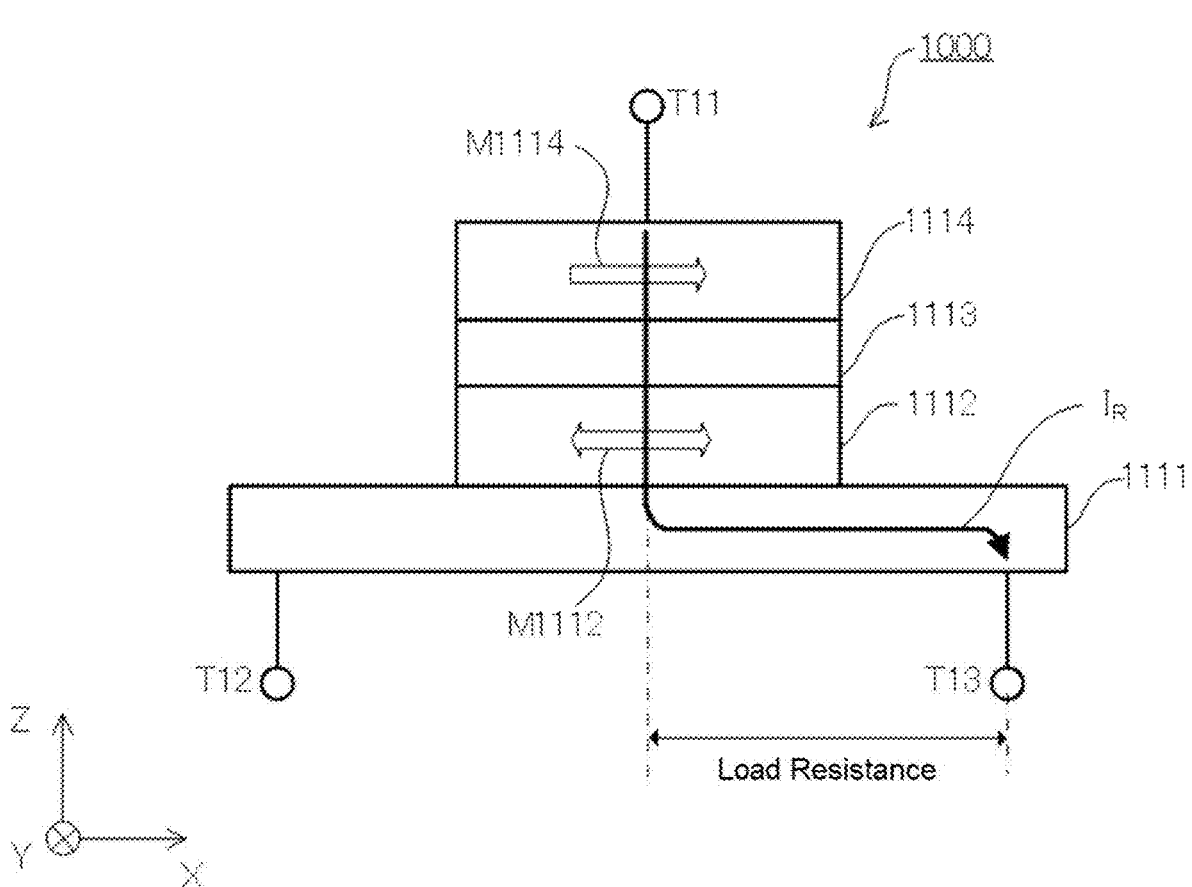
FIG. 19 is a structural diagram illustrating a conventional three-terminal SOT-MRAM.

In the descriptions above, the present invention was explained using an example of the magnetoresistive effect element 100 in which the direction of magnetization M12 of the recording layer 12 and the direction of magnetization M14 of the reference layer 14 are substantially parallel to the extending direction of the channel layer 11 (X axis direction) (for example, θ=0 to)+35°. However, the present invention is not limited to this. For example, as illustrated in FIG. 18A, the present invention may be applied to a magnetoresistive effect element 100A in which the direction of magnetization M12A of the recording layer 12 and the direction of magnetization M14A of the reference layer 14 are substantially parallel to the plane of the recording layer 12 and the reference layer 14, and substantially perpendicular to the extending direction of the channel layer 11 (X axis direction) (+Y axis direction). Also, as illustrated in FIG. 18B, the present invention may be applied to a magnetoresistive effect element 100B in which the direction of magnetization M12B of the recording layer 12 and the direction of magnetization M14B of the reference layer 14 are substantially perpendicular to the plane of the recording layer 12 and the reference layer 14 (+Z axis direction).

As described above, according to an embodiment of the present invention, it is possible to provide a magnetoresistive effect element that can achieve high-speed writing and high-speed reading while keeping the write current $I_W$ low for energy conservation, and a magnetic memory device provided with such a magnetoresistive effect element.

What is claimed is:

1. A magnetoresistive effect element, comprising:
a reference layer, a barrier layer, a recording layer, and a channel layer that are disposed on top of one another; and
a first terminal connected to the reference layer, and a second terminal and a third terminal connected to the channel layer, wherein
the channel layer includes a first channel layer and a second channel layer, the first channel layer having an electrical resistance that is in a range of 2 to 12 times greater than an electrical resistance of the second channel layer,
the second terminal is connected to the first channel layer, and the third terminal is connected to the second channel layer,
a write current flows between the second terminal and the third terminal via the first channel layer and the second channel layer, and
a read current flows between the first terminal and the third terminal.

2. The magnetoresistive effect element according to claim 1, wherein
the reference layer is a ferromagnetic layer in which a magnetization direction is fixed,
the barrier layer is a tunnel insulating layer,
the recording layer is a ferromagnetic layer in which a magnetization direction is variable by a spin orbit torque generated by a write current that flows through the channel layer,
the channel layer contains a heavy metal,
the channel layer has two ends opposite to each other, and the second terminal is connected to one of the two ends of the channel layer and the third terminal is connected to the other one of the two ends of the channel layer,
the first channel layer has a first area that is an area between a junction surface of the channel layer and the recording layer and a connecting point at which the second terminal is connected to the channel layer, and
the second channel layer has a second area that is an area between the joint surface and a connecting point at which the third terminal is connected to the channel layer.

3. The magnetoresistive effect element according to claim 1, wherein the channel layer contains W, Ta, Pt, Pd, WOx, TaOx, PtOx, or PdOx.

4. The magnetoresistive effect element according to claim 1, wherein a thickness of the first channel layer is less than a thickness of the second channel layer.

5. The magnetoresistive effect element according to claim 1, wherein a length of the first channel layer in a first direction parallel to a surface of the channel layer is longer than a length of the second channel layer.

6. The magnetoresistive effect element according to claim 5, wherein the first channel layer is in a spiral shape.

7. The magnetoresistive effect element according to claim 1, wherein a width of the first channel layer in a second direction parallel to a surface of the channel layer is less than a width of the second channel layer.

8. The magnetoresistive effect element according to claim 1, wherein a resistance rate of the first channel layer is higher than a resistance rate of the second channel layer.

9. The magnetoresistive effect element according to claim 1, wherein a circuit element connected to the second terminal has a resistance higher than a resistance of a circuit element connected to the third terminal.

10. The magnetoresistive effect element according to claim 9, wherein the circuit element includes a plurality of transistors, and one of the plurality of transistors is connected to the second terminal and has an ON resistance higher than an ON resistance of an other one of the plurality of transistors that is connected to the third terminal.

11. A magnetic memory device having, as a memory cell, the magnetoresistive effect element according to claim 1.

12. A magnetoresistive effect element, comprising:
  a magnetoresistive effect element including:
    a reference layer, a barrier layer, a recording layer, and a channel layer that are disposed on top of one another; and
    a first terminal connected to the reference layer, and a second terminal and a third terminal connected to the channel layer;
  a write circuit connected between the second terminal and the third terminal; and
  a read circuit connected between the first terminal and the third terminal, wherein
  the channel layer includes a first channel layer to which the second terminal is connected and a second channel layer to which the third terminal is connected;

the write circuit includes a first transistor connected to the second terminal and the second transistor connected to the third terminal, and is configured to write data to a magnetoresistive effect element by a write current that flows between the second terminal and the third terminal via the first channel layer and the second channel layer when the first and second transistors are turned on;

the read circuit is configured to read data from the magnetoresistive effect element by a read current that flows between the first terminal and the third terminal when the second transistor is turned on; and a sum of an electrical resistance of the first channel layer and an on-resistance of the first transistor is greater than a sum of an electrical resistance of the second channel layer and an on-resistance of the second transistor.

13. The magnetoresistive effect element according to claim 12, wherein the electrical resistance of the first channel layer is equal to as the electrical resistance of the second channel layer.

14. The magnetoresistive effect element according to claim 12, wherein the sum of the electrical resistance of the first channel layer and the on-resistance of the first transistor is in a range of 2 to 12 times greater than the sum of the electrical resistance of the second channel layer and the on-resistance of the second transistor.

* * * * *